(12) United States Patent
Shivaram et al.

(10) Patent No.: US 9,577,648 B2
(45) Date of Patent: Feb. 21, 2017

(54) SEMICONDUCTOR DEVICE AND METHOD FOR ACCURATE CLOCK DOMAIN SYNCHRONIZATION OVER A WIDE FREQUENCY RANGE

(71) Applicant: Semtech Corporation, Camarillo, CA (US)

(72) Inventors: Krishna Shivaram, Torrance, CA (US); Eric Vandel, Concise (CH)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 14/588,040

(22) Filed: Dec. 31, 2014

(65) Prior Publication Data
US 2016/0191062 A1 Jun. 30, 2016

(51) Int. Cl.
| | |
|---|---|
| *H03L 7/00* | (2006.01) |
| *H03K 5/135* | (2006.01) |
| *G06F 1/04* | (2006.01) |
| *H03L 7/07* | (2006.01) |
| *H03L 7/081* | (2006.01) |
| *H03L 7/087* | (2006.01) |
| *H03L 7/089* | (2006.01) |
| *H03L 7/091* | (2006.01) |
| *H03L 7/10* | (2006.01) |
| *H03K 5/00* | (2006.01) |

(52) U.S. Cl.
CPC . *H03L 7/00* (2013.01); *G06F 1/04* (2013.01); *H03K 5/135* (2013.01); *H03L 7/07* (2013.01); *H03L 7/087* (2013.01); *H03L 7/089* (2013.01); *H03L 7/0814* (2013.01); *H03L 7/091* (2013.01); *H03L 7/10* (2013.01); *H03K 2005/00019* (2013.01)

(58) Field of Classification Search
USPC ............... 327/165, 166, 291–299, 374, 178, 327/105–123, 141, 144–163; 326/93–98; 716/6; 331/15–17
See application file for complete search history.

(56) References Cited

U.S. PATENT DOCUMENTS

| | | | |
|---|---|---|---|
| 4,719,365 | A | 1/1988 | Misono |
| 5,799,048 | A | 8/1998 | Farjad-Rad et al. |

(Continued)

FOREIGN PATENT DOCUMENTS

| | | |
|---|---|---|
| CN | 103248445 A1 | 8/2013 |
| DE | 102007054262 A1 | 5/2008 |

(Continued)

*Primary Examiner* — Brandon S Cole
(74) *Attorney, Agent, or Firm* — Brian M. Kaufman; Robert D. Atkins; Patent Law Group;Atkins and Associates, P.C.

(57) ABSTRACT

A clock synchronization circuit has a clock sync detector. A first variable delay circuit is coupled to a first input of the clock sync detector. A controller is coupled to a digital output of the clock sync detector and a control input of the first variable delay circuit. A first clock signal is coupled to the first variable delay circuit. A second clock signal is coupled to a second input of the clock sync detector. The clock sync detector includes a first flip-flop and a first delay element coupled between the first variable delay circuit and a data input of the first flip-flop. A second variable delay circuit is coupled to a second input of the clock sync detector. A multiplexer is coupled between the first variable delay circuit and the first input of the clock sync detector. An offset compensation calibrates the clock sync detector.

25 Claims, 9 Drawing Sheets

(56) References Cited

U.S. PATENT DOCUMENTS

| | | | |
|---|---|---|---|
| 6,125,158 A | 9/2000 | Carson et al. | |
| 6,259,328 B1 * | 7/2001 | Wesolowski | H03L 7/143 327/147 |
| 6,329,858 B1 * | 12/2001 | Sobue | G06F 1/10 327/144 |
| 6,445,231 B1 * | 9/2002 | Baker | G11C 7/1051 327/158 |
| 6,675,307 B1 * | 1/2004 | Heitkamp | G06F 1/12 327/149 |
| 6,677,794 B2 | 1/2004 | Kim | |
| 6,950,487 B2 * | 9/2005 | Lin | H03K 5/15013 375/376 |
| 7,042,269 B2 * | 5/2006 | Kao | G06F 1/10 327/295 |
| 7,151,945 B2 | 12/2006 | Myles et al. | |
| 7,440,474 B1 | 10/2008 | Goldman et al. | |
| 7,567,544 B2 | 7/2009 | Myles et al. | |
| 7,616,043 B2 * | 11/2009 | Takano | H03K 19/0016 327/293 |
| 7,619,483 B2 | 11/2009 | van der Valk et al. | |
| 7,642,862 B2 | 1/2010 | van der Valk et al. | |
| 7,683,680 B2 | 3/2010 | Dally et al. | |
| 7,826,582 B2 | 11/2010 | Kuhns et al. | |
| 7,864,894 B2 | 1/2011 | Terada | |
| 7,873,131 B2 * | 1/2011 | Lin | H03K 5/15013 327/147 |
| 7,961,829 B2 | 6/2011 | Shaanan | |
| 7,983,276 B2 | 7/2011 | Crowle et al. | |
| 8,018,950 B2 | 9/2011 | Wu et al. | |
| 8,170,169 B2 | 5/2012 | Martin et al. | |
| 8,223,772 B2 | 7/2012 | Nakajima et al. | |
| 8,274,998 B2 | 9/2012 | Belhadj et al. | |
| 8,345,561 B2 | 1/2013 | Edwards et al. | |
| 8,416,812 B2 | 4/2013 | Radulescu | |
| 8,428,213 B2 | 4/2013 | Tucholski | |
| 8,467,418 B2 | 6/2013 | Aweya et al. | |
| 8,514,098 B2 | 8/2013 | Montgomery et al. | |
| 8,532,241 B2 | 9/2013 | Lee et al. | |
| 8,664,985 B2 * | 3/2014 | Hsueh | H03L 7/0891 327/155 |
| 2003/0080791 A1 * | 5/2003 | Fiscus | H03L 7/0814 327/158 |
| 2005/0237086 A1 * | 10/2005 | Galloway | H03L 7/091 327/16 |
| 2006/0017478 A1 * | 1/2006 | Johnson | H03L 7/0814 327/158 |
| 2008/0159270 A1 | 7/2008 | Burke et al. | |
| 2008/0204103 A1 * | 8/2008 | Jung | G06F 1/10 327/288 |
| 2008/0231324 A1 * | 9/2008 | Liu | H03D 13/004 327/12 |
| 2009/0184741 A1 * | 7/2009 | Suda | G01R 31/31922 327/158 |
| 2009/0219068 A1 | 9/2009 | Mizuhashi et al. | |
| 2010/0134151 A1 | 6/2010 | Tucholski | |
| 2010/0134161 A1 * | 6/2010 | Xu | H03D 13/004 327/157 |
| 2010/0189109 A1 | 7/2010 | Nakajima et al. | |
| 2010/0237914 A1 * | 9/2010 | Katoh | G06F 1/10 327/149 |
| 2011/0013737 A1 | 1/2011 | Lee et al. | |
| 2011/0121875 A1 * | 5/2011 | Lung | G06F 17/505 327/161 |
| 2011/0309948 A1 | 12/2011 | Montgomery et al. | |
| 2012/0139587 A1 | 6/2012 | Drago et al. | |
| 2014/0021987 A1 * | 1/2014 | Okada | H03L 7/24 327/156 |
| 2014/0203854 A1 * | 7/2014 | Jung | H03L 7/0802 327/158 |

FOREIGN PATENT DOCUMENTS

| | | |
|---|---|---|
| DE | 102007054383 A1 | 5/2008 |
| EP | 0613253 A1 | 8/1994 |
| EP | 1244207 A1 | 9/2002 |
| EP | 1816748 A1 | 8/2007 |
| WO | 2005117265 A1 | 12/2005 |
| WO | 2010033255 A1 | 3/2010 |
| WO | 2010039258 A1 | 4/2010 |
| WO | 0184711 A1 | 11/2011 |

\* cited by examiner

SEMICONDUCTOR DEVICE AND METHOD FOR ACCURATE CLOCK DOMAIN SYNCHRONIZATION OVER A WIDE FREQUENCY RANGE

FIELD OF THE INVENTION

The present invention relates in general to semiconductor devices and, more particularly, to a semiconductor device and method for accurate clock domain synchronization over a wide frequency range.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

FIG. 1 illustrates electronic device 50 having a chip carrier substrate or PCB 52 with a plurality of semiconductor packages mounted on a surface of the PCB. Electronic device 50 can have one type of semiconductor package, or multiple types of semiconductor packages, depending on the application. Different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other expansion card that can be inserted into a computer. The semiconductor packages can include microprocessors, memories, application specific integrated circuits (ASIC), programmable logic circuits, analog circuits, radio frequency (RF) circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages. A clock signal is transmitted between semiconductor packages via traces 54.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

A manufacturer of electronic device 50 provides a clock signal to each semiconductor package to operate the synchronous logic elements within each package. Digital circuits of the semiconductor packages include flip-flops or latches which operate on edges of the clock signal. A binary digital value is either a logic zero or a logic one. A clock signal rapidly fluctuates between a logic zero and logic one. When a clock signal transitions from a logic zero to a logic one, the transition is a rising edge of the clock signal. When a clock signal transitions from a logic one to a logic zero, the transition is a falling edge of the clock signal.

Digital circuits formed on semiconductor die within semiconductor packages include flip-flops which store an input value of the flip-flop to the output of the flip-flop when a clock edge occurs. A flip-flop holds the output value until the next clock edge, when a new input value is stored as the output value. Some flip-flops are rising edge-triggered, and transfer the input value to an output of the flip-flop when the rising edge of the clock signal occurs. Other flip-flops are falling edge-triggered, and transfer the input value to the output on the falling edge of the clock signal. Still other flip-flops are triggered on both the rising edge and falling edge of a clock signal.

Outputs of flip-flops are routed through combinational logic, and supplied to the input of other flip-flops, where a value based on the output of the first flip-flop is latched into the second flip-flop on the next active clock edge. In sequential logic, the input of a flip-flop is determined in part by the value latched into the output of the same flip-flop, so that the next value of a flip-flop depends on the present value of the flip-flop. For the output value of one flip-flop to properly be reflected in the latched output of a second flip-flop, the two flip-flops operate using a common clock edge of a common clock signal. The common clock edge triggers the second flip-flop to latch in the input from the first flip-flop at approximately the same time that the first flip-flop changes the output signal to the second flip-flop. Due to propagation delay between the two flip-flops, the second flip-flop latches in the old value before a new value output by the first flip-flop reaches the second flip-flop.

Electronic circuits using flip-flops which operate on a common clock edge are synchronous. A synchronous circuit is a digital circuit in which the parts are synchronized by a clock signal. Many digital circuits are fully synchronous with a global clock signal driving each part of the circuit. When multiple semiconductor packages are provided on PCB 52, a manufacturer of electronic device 50 provides for communication between the semiconductor packages using traces 54. Traces 54 are connected between semiconductor packages to allow one semiconductor package to utilize functionality provided by circuitry of another semiconductor package. A common clock signal is distributed to each semiconductor package to allow synchronous communication between the packages.

FIG. 2*a* illustrates a clock distribution network for electronic device 50. Oscillator 80 is a quartz piezo-electric oscillator, although inductor-capacitor (LC) or resistor-capacitor (RC) resonators are used in some embodiments. In other embodiments, any method of generating a clock signal is used. Oscillator 80 creates a periodic, oscillating electronic signal which is sent to fan-out clock buffer 82 via a trace 54. Fan-out buffer 82 includes an amplifier which feeds the signal back to oscillator 80, causing the oscillator to resonate.

Fan-out buffer 82 outputs the clock signal from oscillator 80 to a plurality of output pins or terminals on the package of the fan-out buffer. Traces 54 route the clock signal to the different semiconductor chips and packages of electronic device 50. Each clock signal to each semiconductor package is generated by oscillator 80 and in sync when the signals leave fan-out buffer 82. Fan-out buffer 82 includes a buffer at the output of each clock signal so that each clock output is powered separately and can handle a similar load.

Each semiconductor package receives the clock signal with a common clock edge which occurs approximately simultaneously. The layout of electronic device 50 is designed so that the propagation delay between fan-out buffer 82 and each semiconductor package is approximately the same. One way to accomplish similar propagation delays is to use traces 54 connecting fan-out buffer 82 to each package which are approximately the same length.

Using a common clock signal for each semiconductor package allows synchronous logic on one of semiconductor packages 56-74 to communicate with synchronous logic on another of the semiconductor packages directly using traces 54. Traces 54 run between the semiconductor packages and include lines for address, data, read, write, and other signals needed for the particular semiconductor devices to communicate synchronously.

To help synchronous logic in one semiconductor package communicate with synchronous logic in another semiconductor package, the clock signals which drive the actual flip-flops of each chip should be synchronized. Even though two clock signals may be synchronized entering two different semiconductor packages, the paths a clock signal uses within the chips may cause the propagation delay to some flip-flops to be different than other flip-flops. Different propagation delays internal to two different semiconductor packages results in the flip-flops of the packages being driven by clock edges occurring at different times, making synchronous communication difficult without violating setup and hold times of the flip-flops.

FIG. 2*b* illustrates a clock tree 90 of semiconductor package 74 as an example. Clock tree 90 receives a clock signal from fan-out buffer 82 at clock input pin 92. Buffers 100-106 distribute the clock signal to flip-flops 107-110. Multiple stages of buffers are used to limit the total load on each individual buffer. While only four total flip-flops and one flip-flop per buffer are illustrated, a single clock tree may include many more than four flip-flops, and multiple flip-flops may receive a clock signal from a single buffer. A clock tree may also provide the clock signal to other types of logic elements besides flip-flops. In other embodiments, clock distribution networks are used which do not follow a tree topology.

Clock tree 90 routes a clock signal throughout semiconductor package 74 to drive the synchronous logic of the semiconductor device. Clock tree 90 injects a certain amount of propagation delay between clock input pin 92 and flip-flops 107-110. Propagation delay is the amount of time between when a clock signal at clock input pin 92 changes and when the clock signal change occurs at flip-flops 107-110. Each buffer 100-106 takes time for a clock signal change at the input of the buffer to be reflected at the output of the buffer. In addition, the clock signal requires a certain amount of time to travel between buffers 100-106 and to flip-flops 107-110 on the illustrated conductive lines.

Each flip-flop 107-110 receives a clock signal from clock input 92 with approximately the same amount of propagation delay due to clock tree 90 being balanced. Clock tree 90 is balanced because the path a clock signal travels to each flip-flop is approximately the same length, and includes the same number of similar buffers. Flip-flops 107-110 communicate with each other synchronously without significant risk of hold time or setup time violations. However, flip-flops in other clock trees, or on other semiconductor devices, should include similar amounts of propagation delay as clock tree 90, or be otherwise synchronized, for reliable synchronous communication.

FIG. 2*c* illustrates LGA 66 which is a central processing unit (CPU). CPU 66 includes clock input pin 112 connected to buffer 120. Buffers 120-126 form a portion of a clock tree for CPU 66, distributing a clock signal on clock input pin 112 to cache module 128, arithmetic logic unit (ALU) 130, registers 132, and input-output (I/O) block 134. Each of the different blocks 128-134 of CPU 66 includes a clock tree similar to clock tree 90 of FIG. 2*b*.

Due to the varied sizes and total amount of flip-flops in blocks 128-134 of CPU 66, the clock trees within each block are different sizes and contribute different amounts of propagation delay between clock input pin 112 and flip-flops of the respective block. Similarly, clock trees in different chips of electronic device 50 include clock trees with different propagation delays. When different propagation delays result in a clock signal arrives at different areas of synchronous logic at different times, clock skew occurs. Clock skew makes synchronous communication between multiple chips, or between multiple modules of a single chip, more difficult. The speed of the clock may need to be slowed down to ensure the hold times and setup times of all flip-flops are observed. Setup time is the amount of time an input signal to a flip-flop must be held at a desired input value prior to the triggering edge of a clock signal to ensure the input value is properly latched to the output of the flip-flop. Hold time of a flip-flop is the amount of time an input to the flip-flop must be held stable after a clock edge to ensure proper operation.

The flip-flops of different chips, and different modules within chips, can be synchronized by balancing the paths of the clock signals to each flip-flop of electronic device 50. While a designer of electronic device 50 can make traces 54 which carry the clock signal to each semiconductor package approximately the same length to balance the propagation delays to each chip, balancing the internal propagation delays between modules of a single chip is more difficult because of the varying sizes and number of flip-flops within different modules. Ensuring a nearly uniform propagation delay among the modules of different semiconductor packages that must communicate synchronously is also difficult. Two chips being used for electronic device 50 may be designed by different manufacturers, with clock propagation delays out of the control of the designer of electronic device 50.

To simplify synchronous communication between different semiconductor devices and clock trees, semiconductor device manufacturers attempt to align edges of a clock signal used by flip-flops of a device with edges of the clock input to the device. FIG. 3 illustrates a clock tree 150 including a clock feedback output which allows another module to observe when a clock edge used by flip-flops of the clock tree occurs. A clock input 152 feeds a clock signal to the clock tree. Buffers 154-159 branch out to provide a clock signal to flip-flops 161-163. Buffer 160 drives clock feedback output port 166. While three flip-flops are illustrated, a clock tree may have more than three flip-flops, and more than one flip-flop may be driven by a single buffer. Flip-flops 161-163 receive clock signals with edges approximately synchronized due to clock tree 150 being properly balanced. However, output signals from flip-flops 161-163 may be routed to flip-flops in other clock trees, and signals from other clock trees may be routed to the inputs of flip-flops 161-163. The other clock trees connected to clock tree 150 do not necessarily include a propagation delay similar to the propagation delay of clock tree 150.

Clock feedback port 166 outputs a clock signal from the clock tree which has clock edges synchronized with edges of the clock signal received by flip-flops 161-163. That is, clock tree 150 is balanced so that the propagation delay between clock input 152 and flip-flops 161-163 is approximately the same as the propagation delay between clock input 152 and clock feedback port 166. Manufacturers use the clock output from clock feedback port 166 to compare the clock used by flip-flops 161-163 with the clock being used by flip-flops in other clock trees, or with a clock signal received by a terminal on the semiconductor device. Modern semiconductor devices include modules which compare clock signals, and adjust the timing of the clock signal at clock input 152 to synchronize the clocks being used by flip-flops in different areas of a chip or different chips on a board.

Manufacturers of electronic and semiconductor devices would like to ensure that different areas of synchronous logic are operating on a common clock edge which occurs at nearly the same time for all flip-flops running on the same clock source. One difficulty is accounting for a wide variation in clock propagation delays and frequencies while maintaining accurate alignment of the clock edges. Comparing two clock signals is difficult at lower frequencies, or when the clock signals are misaligned by greater margins. A method of aligning clock signals which is highly accurate at aligning two clock signals to a common clock edge is not able to quickly and easily align two clocks which are out of phase by a wide margin.

SUMMARY OF THE INVENTION

A need exists for a simple method of clock-phase detection which is accurate over a large frequency range. Accordingly, in one embodiment, the present invention is a clock synchronization circuit comprising a clock sync detector. A first variable delay circuit is coupled to a first input of the clock sync detector. A controller is coupled to a digital output of the clock sync detector and a control input of the first variable delay circuit.

In another embodiment, the present invention is a clock synchronization circuit comprising a first flip-flop. A first delay element is coupled to a data input of the first flip-flop. A first clock signal is coupled to the first delay element. A second clock signal is coupled to a clock input of the first flip-flop.

In another embodiment, the present invention is a clock synchronization circuit comprising a first flip-flop. A first clock signal is coupled to a data input of the first flip-flop. A second clock signal is coupled to a clock input of the first flip-flop.

In another embodiment, the present invention is a method of making a clock synchronization circuit comprising the steps of providing a first flip-flop, coupling a first clock signal to a first input of the first flip-flop, and coupling a second clock signal to a second input of the first flip-flop.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 4A:
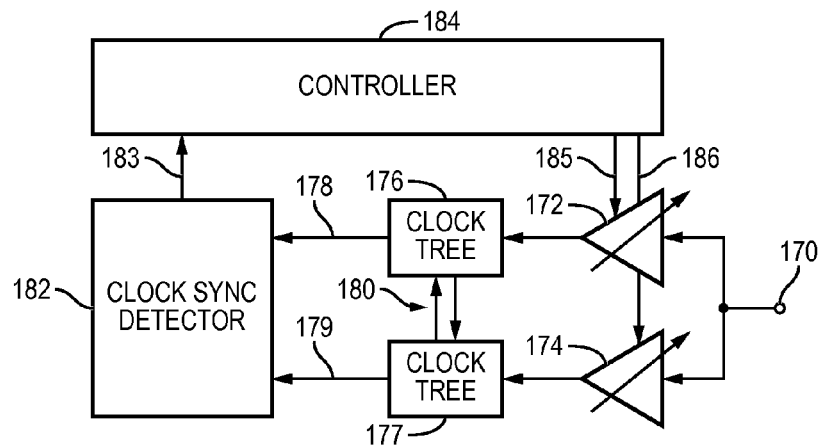
FIGS. 4a-4d illustrate a clock sync detector with separate coarse and fine phase detection capability.

FIG. 4a illustrates an overall system architecture which uses a clock sync detector to synchronize edges of the clocks used by flip-flops of two different areas of a chip. A clock signal is received by the system at clock input 170. Clock input 170 is coupled to the inputs of variable delay circuits 172 and 174. Variable delay circuit 172 introduces a delay and then provides the delayed clock signal to clock tree 176. Variable delay circuit 174 provides a delayed clock signal to clock tree 177. Clock tree 176 includes a clock feedback output 178, and clock tree 177 includes a clock feedback output 179. Signals 180 connect flip-flops in clock tree 176 with flip-flops in clock tree 177 for synchronous communication between the clock trees. Clock feedback outputs 178 and 179 are coupled to inputs of clock sync detector 182.

Clock sync detector 182 compares the timing of edges of clock feedback outputs 178 and 179, determines a phase difference between the two clock signals, and outputs control signals 183 indicating the phase difference to controller 184. Controller 184 outputs delay control signal 185 which controls the amount of delay that variable delay circuit 172 provides between clock input 170 and clock tree 176. Delay control signal 186 controls the delay of variable delay circuit 174 between clock input 170 and clock tree 177. Controller 184 modifies the delays of variable delay circuits 172 and 174 to synchronize edges of the clock signals on clock feedback outputs 178 and 179.

Variable delay circuit 172 receives a clock signal from clock input 170, and outputs the clock signal delayed by a variable amount of time. Delay control signal 185 controls the amount of time after a rising or falling edge of a clock signal from clock input 170 when a rising or falling edge is output from variable delay circuit 172. The amount of delay provided by variable delay circuit 172 is controlled by controller 184 based on feedback from clock sync detector 182. Variable delay circuit 172 includes a plurality of delay elements, e.g., buffers or CMOS inverters, connected in series. Each delay element includes an output which feeds another delay element, but is also capable of being connected to the output of variable delay circuit 172. Controller 184 controls the total delay between the input and output of variable delay circuit 172 by controlling which series delay element output is connected to the output of the variable delay circuit. Variable delay circuit 174 is formed and operates similarly to variable delay circuit 172. In other embodiments, other types of variable delay circuits are used.

The edges of clock inputs of variable delay circuits 172 and 174 occur at approximately the same time because the inputs of both variable delay circuits are connected to clock input 170. However, controller 184 varies the delay of variable delay circuits 172 and 174 so that the clock signals output by the variable delay circuits have edges which occur at different times, i.e., are out of sync. To synchronize the clock edges used by synchronous logic in clock trees 176 and 177, the clock signals output by variable delay circuits 172 and 174 are out of sync by approximately the same amount of time as the difference in propagation delay between clock tree 176 and clock tree 177. Controller 184 varies the delays as required to synchronize the clock signal received by flip-flops in clock tree 176 with the clock signal of flip-flops in clock tree 177. In other embodiments, variable delay circuits 172 and 174 receive two different clock signals which are not synchronized, and controller 184 varies the delays of the variable delay circuits to synchronize the clocks received by flip-flops in clock trees 176 and 177.

Clock tree 176 includes a clock input which is distributed to a plurality of flip-flops in the clock tree. Clock tree 176 is balanced so that each flip-flop receives edges of the clock at approximately the same time. Clock feedback output 178 includes a clock signal which is in sync with the clock signal received by the flip-flops of clock tree 176. Clock tree 177 operates similarly to clock tree 176, but includes a different layout with a different propagation delay between the clock input and the clock received by flip-flops.

Variable delay circuits 172 and 174 are operated such that the different delays of the clock inputs to clock trees 176 and 177 compensate for the different propagation delays of the clock trees. The flip-flops of clock trees 176 and 177 receive clock signals with synchronized clock edges because the different delays of variable delay circuits 172 and 174 counteract the different propagation delays of clock trees 176 and 177. When synchronization is achieved, the total delay of variable delay circuit 172 and clock tree 176 is approximately equal to the total delay of variable delay circuit 174 and clock tree 177 so that clock edges of clock feedback output 178 and clock feedback output 179 occur at approximately the same time.

Signals 180 are coupled between flip-flops of clock tree 176 and flip-flops of clock tree 177. Signals 180 provide synchronous communication between clock trees 176 and 177. Some signals 180 are coupled between outputs of flip-flops in clock tree 176 to inputs of flip-flops in clock tree 177. Other signals 180 are coupled between outputs of flip-flops in clock tree 177 to inputs of flip-flops in clock tree 176. In one embodiment, flip-flops of clock tree 176 are used to implement the ALU of a CPU, and flip-flops of clock tree 177 provide registers for the CPU. The ALU of clock tree 176 uses signals 180 to synchronously read and write values to and from the registers of clock tree 177. Without synchronizing the edges of the clocks used by flip-flops in clock trees 176 and 177, a slower clock is used for clock input 170 because the synchronous communication using signals 180 must be slow enough to account for the difference in timing delay in each clock tree. A faster, or higher frequency, clock signal is used when the edges of the clock signal are synchronized at each flip-flop.

Clock feedback output 178 is a clock signal with edges synchronized to the edges of the clock signal driving flip-flops in clock tree 176. Clock tree 176 provides a synchronized clock edge to each flip-flop driven by the clock tree, and to the clock feedback output 178, by being balanced. The paths between the clock input to clock tree 176 and each individual flip-flop include similar topologies so that the delay to each flip-flop is approximately equal. Clock feedback output 179 includes edges synchronized with the clock signal driving the flip-flops in clock tree 177. Clock tree 177 is balanced by design so that each flip-flop receives clock edges at approximately the same time as clock feedback output 179.

Figure 4B:
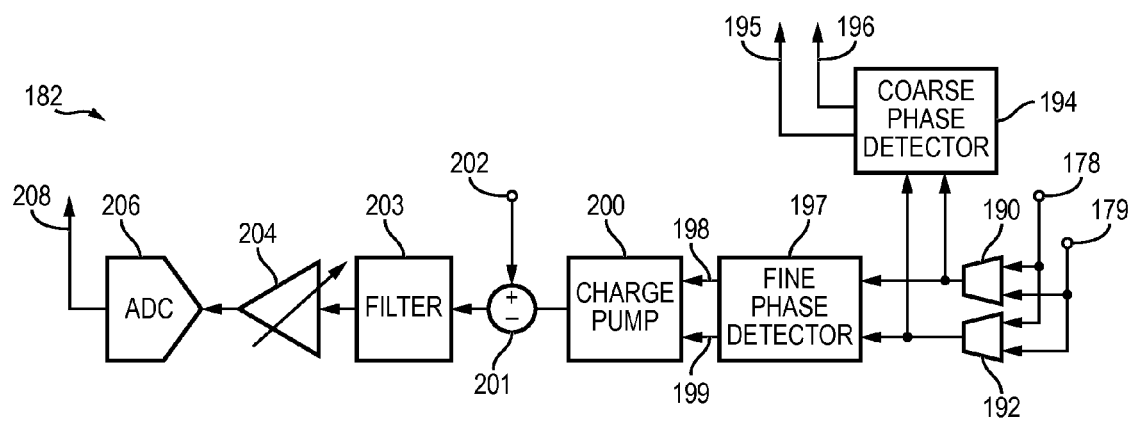
Figure 4C:
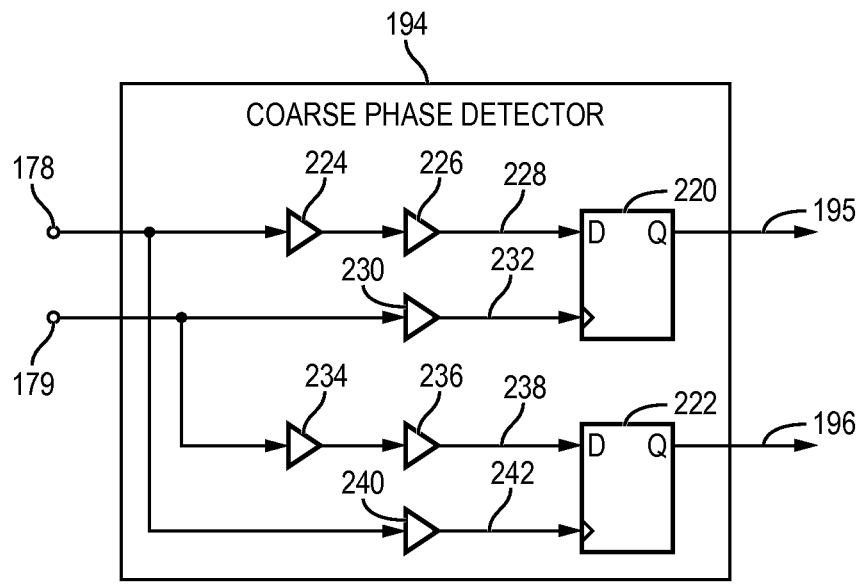
Figure 4D:
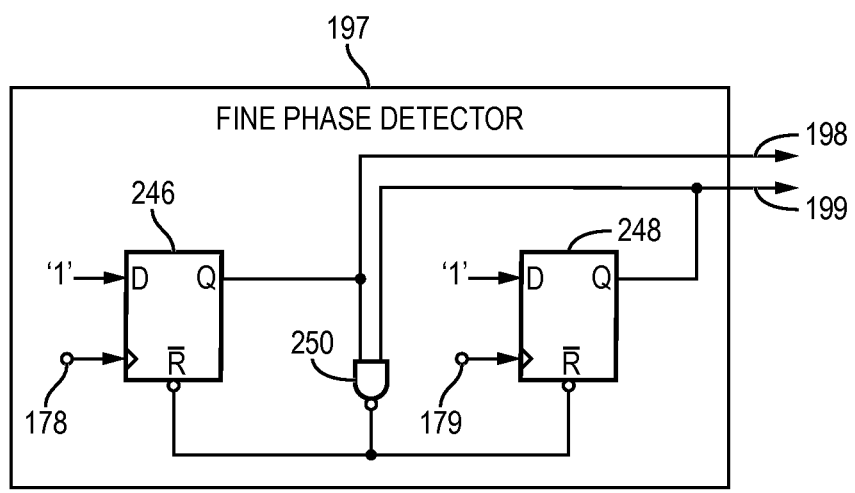

Clock feedback outputs 178 and 179 are coupled to clock sync detector 182, shown in detail in FIGS. 4b-4d. Clock sync detector 182 compares the clock signal of clock feedback output 178 against the clock signal of clock feedback output 179, to determine a phase difference between the two signals. If clock feedback outputs 178 and 179 are out of phase with each other, i.e., the clock edges of the clock feedback outputs are not synchronized, then a difference in the propagation delays of clock trees 176 and 177 is not being properly counteracted by variable delay circuits 172 and 174. Clock sync detector 182 provides output signal 183 to controller 184, which tells the controller how far out of phase clock feedback outputs 178 and 179 are. If clock feedback outputs 178 and 179 are synchronized to include clock edges which occur at approximately the same time, clock sync detector 182 communicates synchronization in a similar manner.

Controller 184 receives signal 183 from clock sync detector 182 indicating the phase difference between clock feedback outputs 178 and 179, and adjusts the variable delay circuits 172 and 174 using delay control signals 185 and 186, respectively. Controller 184 is any general purpose microcontroller or processor. In some embodiments, the functionality of controller 184 is performed by the same microcontroller or CPU which is being driven by clock trees 176 and 177. In other embodiments, controller 184 is a hardware module designed specifically to translate output signal 183 from clock sync detector 182 into control signals 185 and 186 for variable delay circuits 172 and 174.

In one possible case, clock sync detector 182 indicates to controller 184 that clock feedback output 178 is lagging behind clock feedback output 179, i.e., a clock edge is received by clock sync detector 182 from clock tree 176 after the same clock edge is received from clock tree 177. If clock feedback output 178 lags behind clock feedback output 179, controller 184 increases the delay of variable delay circuit 174, or decreases the delay of variable delay circuit 172, to bring the cumulative delay of clock tree 176 and variable delay circuit 172 closer to equal with the cumulative delay of clock tree 177 and variable delay circuit 174.

In another case, clock sync detector 182 indicates to controller 184 that clock feedback output 178 is ahead of clock feedback output 179, i.e., a clock edge is received by clock sync detector 182 from clock tree 176 before the same clock edge is received from clock tree 177. Controller 184 decreases the delay of variable delay circuit 174, or increases the delay of variable delay circuit 172, to bring the cumulative delay of clock tree 176 and variable delay circuit 172 closer to equal with the cumulative delay of clock tree 177 and variable delay circuit 174.

Controller 184 adjusts variable delay circuits 172 and 174 until clock sync detector 182 indicates that clock feedback outputs 178 and 179 are synchronized to within a resolution of the clock sync detector. When clock feedback outputs 178 and 179 are synchronized so that common clock edges occur at approximately the same time, synchronous communication between clock trees 176 and 177 occurs properly over signals 180. Clock sync detector 182 continues to compare clock feedback output 178 to clock feedback output 179. As environmental factors, such as voltage or temperature, change during the operation of the electronic device, the propagation delays of clock trees 176 and 177 are modified by the change. Clock sync detector 182 signals controller 184 that clock feedback outputs 178 and 179 have fallen out of sync, and controller 184 makes the necessary correction.

FIG. 4b illustrates clock sync detector 182 in detail. Clock sync detector 182 receives clock feedback output 178 from clock tree 176 and clock feedback output 179 from clock tree 177. Clock feedback outputs 178 and 179, or simply clock signals 178 and 179, are each routed to inputs of multiplexer (MUX) 190 and MUX 192. The outputs of MUX 190 and MUX 192 are coupled to inputs of coarse phase detector, or coarse detection block 194. Coarse phase detector 194 includes two digital output bits 195 and 196 which are routed to controller 184 as a part of signal 183 in FIG. 4a. The outputs of MUX 190 and MUX 192 are also coupled to fine phase detector 197. Fine phase detector 197 includes two output signals 198 and 199 coupled to charge pump 200. Charge pump 200 outputs an electrical current through current offset block 201 to filter 203. Filter 203 outputs an analog voltage proportional to the misalignment between the phases of clock signals 178 and 179 to variable gain amplifier 204. Variable gain amplifier 204 applies a gain and couples the output of filter 203 to analog-to-digital converter (ADC) 206. ADC 206 converts the analog signal proportional to the misalignment between clock phases to a digital value, and outputs the digital value to controller 184 as fine detection output 208, which comprises signal 183 in FIG. 4a along with output bits 195 and 196. Fine phase detector 197, charge pump 200, current offset 201, filter 203, variable gain amplifier 204, and ADC 206 comprise a fine detection block. In other embodiments, other fine detection block topologies are used along with coarse phase detector 194.

MUX 190 and MUX 192 each have both clock signals 178 and 179 connected as inputs, and outputs connected to both coarse phase detector 194 and fine phase detector 197. MUX 190 and MUX 192 allow controller 184 to connect either of clock signals 178 and 179 to either input of phase detectors 194 and 197. During normal operation, controller 184 uses control signals to MUX 190 and MUX 192 to connect clock signals 178 and 179 each to one of the inputs of coarse phase detector 194 and fine phase detector 197. Having clock signals 178 and 179 each connected to an input of phase detectors 194 and 197 allows the phase detectors to compare the two signals and determine a phase difference for output to controller 184. Utilizing a separate MUX for each input path to phase detectors 194 and 197 balances the propagation delay from clock trees 176 and 177 to phase detectors 194 and 197. Having balanced propagation delays improves accuracy of phase detection and reduces the effect of changes in supply voltage, operating temperature, or manufacturing process parameters.

Controller 184 also uses MUX 190 and MUX 192 to couple clock signal 178 to both inputs of phase detectors 194 and 197, or clock signal 179 can be coupled to both inputs of the phase detectors. Connecting the same clock signal to both inputs of phase detectors 194 and 197 allows controller 184 to calibrate clock sync detector 182. With the same clock signal 178 or 179 coupled to both inputs of coarse phase detector 194 and fine phase detector 197, outputs 195, 196, and 208 to controller 184 should ideally indicate perfect synchronization. However, because of variations introduced during the process of forming the semiconductor device, or in operating temperature and supply voltage while the device is running, fine detection output 208 may not indicate exact alignment when the same clock is routed to both inputs of fine phase detector 197.

Controller 184 uses offset control signal 202 to control the magnitude of the offset introduced by current offset 201 between charge pump 200 and filter 203. Controller 184 determines an amount by which fine detection output 208 is offset when the inputs of fine phase detector 197 are connected to a single clock signal 178 or 179, and adjusts offset control signal 202 so that current offset 201 makes output 208 approximately equal to zero. In some embodiments, controller 194 averages an offset in output 208 when clock signal 178 is connected to both inputs of fine phase detector 197 with the offset when clock signal 179 is connected to both inputs of fine phase detector 197, and sets offset control signal 202 based on the average. Once controller 184 determines a value for offset control signal 202, the controller sets MUX 190 and MUX 192 so that each of clock signals 178 and 179 is connected to one input of phase detectors 194 and 197.

Coarse phase detector 194, illustrated in detail in FIG. 4c, receives clock signals 178 and 179, and outputs two digital bits 195 and 196 to controller 184. Digital output bits 195 and 196 are both logic zero when clock signals 178 and 179 are nearly in phase. When digital output bits 195 and 196 are both logic zero, controller 184 has clock signals 178 and 179 within the "fine detect window," explained in further detail below with reference to FIG. 5e. The fine detect window means that common edges of the input clock signals occur as close as coarse phase detector 194 is capable of detecting, and the output of fine phase detector 197 is used by controller 184 to make finer adjustments. In embodiments which utilize differential clock signals, two coarse phase detectors are used to balance the load between the positive and negative differential lines of each clock signal.

Digital output bits 195 and 196 are both logic one when clock signals 178 and 179 are nearly 180 degrees out of phase. A period of a clock signal, i.e., the distance between two successive rising edges or two successive falling edges, is 360 degrees. Therefore, two clock signals with the same period are maximally out of phase when the phase difference is 180 degrees.

When clock signal 178 is lagging behind clock signal 179, output bit 195 is a logic zero while output bit 196 is a logic one. When clock signal 179 is lagging behind clock signal 178, output bit 196 is a logic zero while output bit 195 is a logic one. When only one of output bits 195 and 196 are logic one, controller 184 knows that the clock signals 178 and 179 are out of phase, and also knows which clock signal is ahead and which is behind. Controller 184 makes broad adjustments to variable delay circuit 172, variable delay circuit 174, or both variable delay circuits 172 and 174, in the direction necessary to bring clock signals 178 and 179 closer to being in phase. If both output bits 195 and 196 are logic one, controller 184 adjusts variable delay circuits 172 and 174 in either direction to get closer to the fine detect window.

If output bit 195 is a logic one while output bit 196 is a logic zero, controller 184 decreases the delay of variable delay circuit 174, increases the delay of variable delay circuit 172, or both, to bring clock signals 178 and 179 closer to being in phase. If output bit 196 is a logic one while output bit 195 is a logic zero, controller 184 decreases the delay of variable delay circuit 172, increases the delay of variable delay circuit 174, or both, to bring clock signals 178 and 179 closer to being in phase. Controller 184 continues to make broad adjustments to variable delay circuits 172 and 174 until both output bits 195 and 196 become logic zero, indicating that clock signals 178 and 179 are in the fine detect window, i.e., in phase to within the resolution of coarse phase detector 194.

If controller 184 adjusts variable delay circuits 172 and 174, and output bits 195 and 196 do not change, the controller makes another adjustment in the same direction. If output bits 195 and 196 both become logic zero, controller 184 has found the fine detect window. Controller 184 has adjusted clock signals 178 and 179 to be as close to in phase as is possible by looking only at coarse phase detector 194 output bits 195 and 196. Clock signals 178 and 179 are close enough to being in phase that fine phase detector 197 gives meaningful output to controller 184. Controller 184 uses fine detection output 208 to determine how much of a fine adjustment is needed to variable delay circuits 172 and 174 to synchronize clock signals 178 and 179. In one embodiment, controller 184 adjusts variable delay circuits 172 and 174 by a first amount, and determines a magnitude by which fine detection output 208 changes. Controller 184 extrapolates to determine how much further variable delay circuits 172 and 174 need to be adjusted to synchronize clock signal 178 to clock signal 179 and center output 208.

If controller 184 adjusts variable delay circuits 172 and 174, and output bits 195 and 196 swap logic levels, i.e., output bit 195 goes from logic one to logic zero and output bit 196 goes from logic zero to logic one or vice versa, controller 184 realizes the broad adjustment was too large. Controller 184 makes a smaller adjustment in the opposite direction to get the phases of clock signals 178 and 179 within the fine detect window.

Controller 184 uses output bits 195 and 196 to adjust variable delay circuits 172 and 174 until clock signals 178 and 179 are within the fine detect window, i.e., both output bits 195 and 196 are logic zero. Within the fine detect window, controller 184 utilizes fine detection output 208 to make finer adjustments to variable delay circuits 172 and 174, further aligning the edges of clock signals 178 and 179.

Fine phase detector 197 includes two output signals, 198 and 199, which control charge pump 200. Signals 198 and 199 of fine phase detector 197 are generated by digital logic connected to clock signals 178 and 179. The two outputs to charge pump 200 are generated by comparing clock signal 178 and 179. A pulse is generated each clock cycle on one of the outputs from fine phase detector 197 to charge pump 200. A pulse on output signal 198 indicates clock signal 178 is leading clock 179, while a pulse on output signal 199 indicates clock signal 179 is leading clock 178. One possible circuit used for fine phase detector 197 is illustrated in FIG. 4*d*, although other phase detection circuits are used in other embodiments.

One of outputs 198 and 199 of fine phase detector 197 pulses every clock cycle with a pulse width proportional to the phase difference between clock signals 178 and 179. Only one output to charge pump 200 has a pulse each clock cycle, indicating to charge pump 200 which direction clock signals 178 and 179 are out of phase. In one embodiment, one output to charge pump 200 includes a pulse proportional to the phase difference between 178 and 179 each clock cycle, while the other output to charge pump 200 includes a shorter pulse each clock cycle to reset fine phase detector 197. When clock signals 178 and 179 are perfectly in phase, the outputs of fine phase detector 197 do not pulse. In some embodiments, both outputs include short pulses when clock signals 178 and 179 are perfectly in phase.

Charge pump 200 includes two current sources, each controlled by one of outputs 198 and 199 from fine phase detector 197. Output 198 from fine phase detector 197 triggers a current source in charge pump 200 which causes current to flow from a voltage source to filter 203. Output 199 from fine phase detector 197 triggers a current source in charge pump 200 which causes current to flow from filter 203 to a ground potential. Charge pump 200 adds charge to filter 203 when clock signal 178 leads and removes charge from filter 203 when clock signal 179 leads. In other embodiments, charge pump 200 adds charge to filter 203 when clock signal 179 leads and removes charge from filter 203 when clock signal 178 leads.

Current offset 201 adds to, or subtracts from, the current at the output of charge pump 200 as a calibration mechanism. At boot time, or at any other desired time, controller 184 uses MUX 190 and MUX 192 to connect either clock 178 or clock 179 to both inputs of fine phase detector 197. Controller 184 reads output 208 and adjusts current offset 201 to center output 208. Current offset 201 allows for correction of variations in process, voltage, or temperature. In one embodiment, a resistive digital-to-analog converter (RDAC) is used for current offset 201. In other embodiments, other types of DACs are used, or an analog offset is used for current offset 201.

Filter 203 includes a capacitor which is charged and discharged by the current from charge pump 200. Filter 203 translates the current from charge pump 200 into a voltage level output to ADC 206 through variable gain amplifier 204. When clock signals 178 and 179 are in phase, the voltage output of filter 203 is approximately centered between a ground potential and the supply voltage, or between any two voltage levels provided to ADC 206 for use as reference voltages. When clock signals 178 and 179 are out of phase, the pulses from fine phase detector 197 cause charge pump 200 to add charge to or draw charge from filter 203. The voltage of filter 203 drifts up or down as charge pump 200 adds charge to or removes charge from filter 203.

Variable gain amplifier 204 applies a gain to the voltage level output from filter 203. Variable gain amplifier 204 allows controller 184 to set a gain level, which controls how far off center the voltage output of filter 203 is when the limits of ADC 206 output 208 are reached. In one embodiment, controller 184 sets variable gain amplifier 204 so that fine detection output 208 is at a positive or negative maximum at the same amount of misalignment as when output bits 195 or 196 become logic one. Setting variable gain amplifier 206 so that the limits of output 208 are aligned with the fine detect window improves the resolution of feedback to controller 184 in the fine detect window.

ADC 206 converts the analog voltage from filter 203, with gain applied by variable gain amplifier 204, to a digital value usable by controller 184. Output 208 of ADC 206 is a two's complement number, which is zero when the output of variable gain amplifier 204 is centered between a power supply rail and ground voltage supplied to ADC 206. Higher positive numbers are sent to controller 184 via output 208 when the voltage from variable gain amplifier 204 is closer to the power supply voltage of ADC 206. Higher magnitude negative numbers are sent to controller 184 via output 208 when the voltage from variable gain amplifier 204 is closer to the ground potential supplied to ADC 206. In other embodiments, the digital output 208 of ADC 206 is an absolute value which ranges from zero to a maximum value based on the number of bits of output 208. A mid-range value indicates clock signals 178 and 179 are in sync. Values closer to zero indicate clock signal 179 is leading. Values closer to the maximum indicate clock signal 178 is leading.

When the voltage from variable gain amplifier 204 to ADC 206 is over the supply voltage or below ground voltage of the ADC, output 208 is saturated and outputs the same value as if the voltage from the variable gain amplifier were approximately equal to the supply voltage or ground voltage. In some embodiments, an RDAC or other method is used to change the reference voltages of ADC 206. Changing the reference voltages input to ADC 206 resizes the fine detect window by modifying the full scale voltage of the ADC. Changing the reference voltage of ADC 206 is used in addition to or instead of variable gain amplifier 204 to resize the fine detect window.

Fine detection output 208 is a digital value approximately proportional to the time difference between a clock edge of clock signal 178 and the same clock edge on clock signal 179. Controller 184 makes fine adjustments to variable delay circuits 172 and 174 and output 208 changes accordingly. Controller 184 adjusts variable delay circuits 172 and 174 so that output 208 is approximately centered between a minimum and maximum output value of ADC 206, which indicates that clock signals 178 and 179 are approximately synchronized.

When clock signals 178 and 179 are within the fine detect window, but clock signal 178 leads clock signal 179, fine phase detector 197 generates a pulse, proportional to the phase difference of the clock signals, on output 198 each clock cycle. Output 199 remains low, or includes a pulse each clock cycle just long enough to reset fine phase detector 197. A current source in charge pump 200 which adds charge to filter 203 is controlled by output 198, while a current source in the charge pump which removes charge from filter 203 is controlled by output 199. The longer pulse of output 198 relative to a pulse of output 199 results in a net addition of charge to filter 203. Each clock cycle in which clock signal 178 leads clock signal 179, another pulse on output 198 adds charge to filter 203. Additional charge on filter 203 raises the voltage level of the output of filter 203 and the input to ADC 206. The digital value of output 208 from ADC 206 increases away from center to indicate to controller 184 that clock signal 178 is ahead of clock signal 179.

When clock signals 178 and 179 are within the fine detect window, but clock signal 178 trails clock signal 179, fine phase detector 197 generates a pulse, proportional to the phase difference of the clock signals, on output 199 each clock cycle. Output 198 remains low, or includes a pulse each clock cycle just long enough to reset fine phase detector 197. A current source in charge pump 200 which adds charge to filter 203 is controlled by output 198, while a current source in the charge pump which removes charge from filter 203 is controlled by output 199. The longer pulse of output 199 relative to a pulse of output 198 results in a net reduction of the charge on filter 203. Each clock cycle in which clock signal 178 trails clock signal 179, another pulse on output 199 removes charge from filter 203. Reducing the charge on filter 203 lowers the voltage level of the output of filter 203 and the input to ADC 206. The digital value of output 208 from ADC 206 decreases away from center to indicate to controller 184 that clock signal 178 is behind clock signal 179.

FIG. 4c illustrates coarse phase detector 194 in detail. Coarse phase detector 194 receives clock signals 178 and 179 as inputs, and outputs two digital bits 195 and 196. Output bits 195 and 196 indicate which clock signal 178 or 179 is leading, or indicates that the clock signals are approximately 180 degrees out of phase or approximately in phase. Output 195 is generated by flip-flop 220 using clock signal 179 as a clock to sample a delayed version of clock signal 178. Output 196 is generated by flip-flop 222 using clock signal 178 as a clock to sample a delayed version of clock signal 179. Buffers 224 and 226 introduce a delay of length $t_{DELAY}$ between clock signal 178 and flip-flop 220 to create delayed clock signal 228. Buffer 230 creates sample clock 232 from clock signal 179 to drive a clock input of flip-flop 220. Buffers 234 and 236 introduce a delay of length $t_{DELAY}$ between clock signal 179 and flip-flop 222 to create delayed clock signal 238. Buffer 240 creates sample clock 242 from clock signal 178 to drive a clock input of flip-flop 222. In some embodiments, buffers 230 and 240 are not used, and clock signals 178 and 179 are used directly to clock flip-flops 220 and 222.

Buffers 224 and 226 introduce a delay of $t_{DELAY}$ between clock signal 178 and flip-flop 220. Buffers 234 and 236 introduce a delay of $t_{DELAY}$ between clock signal 179 and flip-flop 222. In other embodiments, different numbers of buffers are used, or other types of delay elements are used, to create a desired delay length, $t_{DELAY}$. In one embodiment, a delay is created using CMOS inverters as the delay elements. The value of $t_{DELAY}$ controls the size of the fine detect window, i.e., the misalignment between clock signal 178 and 179 when output bit 195 or 196 goes to logic one. The value of $t_{DELAY}$ is less than half of the period of clock signals 178 and 179 so that the fine detect window is not larger than the period of the clock signals. The value of $t_{DELAY}$ is greater than the sum of the hold time and setup time of one flip-flop 220 or 222. In some embodiments, variable delay circuits, similar to variable delay circuits 172 and 174, are used instead of buffers 224, 226, 234, and 236. Variable delay circuits allow $t_{DELAY}$ to be modified, which changes the size of the fine detect window. In embodiments where buffer 230 is not an ideal buffer with zero propagation delay, $t_{DELAY}$ is the difference between the total propagation delay of buffers 224 and 226 and the propagation delay of buffer 230. Buffers 234 and 236 operate similarly to buffers 224 and 226.

Flip-flops 220 and 222 include a clock signal input, a data input, and an output. The clock signal input of a flip-flop is indicated by a triangle, the data input is indicated by the letter 'D', and the output is indicated by the letter 'Q'. At the rising edge of the clock signal input, a flip-flop sets the output to the digital value being driven to the data input. At times other than the rising edge of the clock signal input, the data input of a flip-flop changes but the flip-flop retains the output at the value which was on the input at the last rising edge of the clock input. The output of a flip-flop does not normally change except on the rising edge of the clock input signal. In some embodiments, flip-flops are negative edge triggered, or triggered by both the negative edge and positive edge of a clock signal input. In other embodiments, flip-flops are level triggered, and referred to as latches.

Flip-flop 220 samples delayed clock signal 228 at every rising edge of sample clock 232. When a rising edge of sample clock 232 occurs, flip-flop 220 changes output bit 195 to be equal to the value of delayed clock signal 228. If a rising edge of clock signal 178 occurs at the same time as a rising edge of clock signal 179, i.e., clock signals 178 and 179 are synchronized, then the rising edge of clock signal 228 will occur $t_{DELAY}$ after a rising edge of sample clock 232. At the rising edge of sample clock 232, clock signal 228 has not had a rising edge, i.e., transitioned from logic zero to logic one, and remains a logic zero. Accordingly, flip-flop 220 drives output bit 195 to a logic zero which is the value of the data input. Output bit 195 remains a logic zero at least until the next rising edge of sample clock 232.

If a rising edge of clock signal 178 occurs prior to a rising edge of clock signal 179, i.e., clock signal 178 leads clock signal 179, by a time period greater than $t_{DELAY}$, then a rising edge of delayed clock signal 228 occurs prior to a rising edge of sample clock 232. At the rising edge of sample clock 232, delayed clock signal 228 has already had a rising edge and is at a logic one value. Flip-flop 220 drives output bit 195 to a logic one, indicating to controller 184 that clock signal 179 is lagging behind clock signal 178 by an amount greater than $t_{DELAY}$.

If clock signal 178 lags behind clock signal 179, delayed clock signal 228 will lag further behind sample clock 232 by an additional $t_{DELAY}$. Output bit 195 will be set to a logic zero because the rising edge of sample clock 232 occurs before the rising edge of delayed clock signal 228. However, if clock signal 178 lags behind clock signal 179 by a great enough amount that the rising edge of clock signal 179 occurs within $t_{DELAY}$ after the falling edge of clock signal 178, then the rising edge of sample clock 232 occurs prior to the falling edge of delayed clock signal 228. Delayed clock signal 228 remains a logic one at the rising edge of sample clock 232, and output bit 195 is set to a logic one.

Flip-flop 222 operates similarly to flip-flop 220 to create output bit 196. Sample clock 242 provides a rising edge to flip-flop 222 which causes the value of output bit 196 to change to the value of delayed clock 238. When clock signals 178 and 179 are synchronized, buffers 234 and 236 delay the clock by $t_{DELAY}$ so that delayed clock 238 remains a logic zero at the rising edge of sample clock 242. If clock signal 178 lags behind clock signal 179 by a value greater than $t_{DELAY}$, then the rising edge of delayed clock signal 238 occurs prior to the rising edge of sample clock 242. Flip-flop 222 sets output bit 196 to a logic one.

Coarse phase detector 194 provides a two-bit indication of the misalignment between clock signals 178 and 179 to controller 184. Clock signals 178 and 179 are within the fine detect window when the rising edge of clock signal 178 occurs within $t_{DELAY}$ of clock signal 179, and both output bit 195 and 196 are logic zero. Output bit 195 indicates to controller 184 that clock signal 178 is ahead of clock signal 179 when logic one. Output bit 196 being a logic one indicates that clock signal 178 is running behind clock signal 179. When both output bits 195 and 196 are logic one, clock signals 178 and 179 are within $t_{DELAY}$ of being 180 degrees out of phase.

FIG. 4d illustrates fine phase detector 197. Fine phase detector 197 includes flip-flop 246 and flip-flop 248. Flip-flop 246 generates output 198 to charge pump 200 by sampling a logic one on the rising edge of clock signal 178. Flip-flop 248 generates output 199 to charge pump 200 by sampling a logic one on the rising edge of clock signal 179. NAND gate 250 generates a reset pulse to flip-flops 246 and 248 when both outputs 198 and 199 are a logic one.

Flip-flops 246 and 248 operate similarly to flip-flops 220 and 222 in FIG. 4c. Flip-flops 220 and 222 have an additional input which is an active-low reset signal. The active-low reset signal is signified by the symbol R, which is a horizontal line over the letter 'R'. The reset input of a flip-flop forces the output of the flip-flop to a logic zero when the reset signal is active. The reset input causes a flip-flop to output a logic zero without regard to the state of the clock input and data input. A change in the data input of a flip-flop is reflected at the output only on the rising edge of the clock input, while the reset input of the flip-flop affects the output signal without the need for a clock edge to occur first.

NAND gate 250 is a NAND gate. NAND gates output a logic zero if both inputs to the NAND gate are logic one. The NAND gate output is a logic one if either input is a logic zero, or if both inputs are logic zero. NAND gate 250 pulls the reset input of flip-flops 246 and 248 to logic zero when both output signals 198 and 199 are logic one. Flip-flops 246 and 248 are reset by the active-low reset inputs being logic zero, which causes the output of the flip-flops to become logic zero without waiting for the edge of the clock signal inputs. When the reset signal from NAND gate 250 causes the outputs of flip-flops 246 and 248 to be logic zero, the output of NAND gate 250, and therefore the reset inputs to the flip-flops, becomes logic one. Thus ends the reset pulse, allowing the outputs of flip-flops 220 and 222 to become logic one again on the next rising edge of the respective clock inputs.

Output 198 becomes a logic one on the rising edge of clock signal 178 because the data input of flip-flop 246 is tied to a logic one signal. Output 199 becomes a logic one on the rising edge of clock signal 179 because the data input of flip-flop 248 is tied to a logic one signal. When both outputs 198 and 199 are logic one, NAND gate 250 generates a reset pulse which causes both outputs 198 and 199 to return to logic zero until the next rising edge of the clock inputs.

When clock signal 179 lags behind clock signal 178, the rising edge of clock signal 178 causes output 198 to go to a logic one prior to the rising edge of clock signal 179. Output 198 is a logic one from the rising edge of clock signal 178 to the rising edge of clock signal 179. At the rising edge of clock signal 179, output 199 becomes a logic one. With both outputs 198 and 199 at a logic one, the output of NAND gate 250 is a logic zero, which resets flip-flops 246 and 248 and clears outputs 198 and 199 to logic zero. While output 198 is high for a time period proportional to the misalignment between clock signals 178 and 179, output 199 is only high long enough for the logic one value to propagate through NAND gate 250 and reset flip-flops 246 and 248.

When clock signal 179 is ahead of clock signal 178, output 199 is logic one for a time period proportional to the misalignment of clocks signals 178 and 179, while output 198 is logic one only long enough to reset flip-flops 246 and 248. Output bits 198 and 199 operate two current sources in charge pump 200. Because the output 198 or 199 indicating the direction of misalignment is higher for a greater portion of each clock cycle, charge pump 200 properly adds a net charge to, or removes a net charge from, filter 203.

Clock sync detector 182 includes both coarse phase detection and fine phase detection. Coarse phase detector 194 indicates to controller 184 which input clock signal 178 or 179 lags behind the other so that controller 184 can quickly find the fine detect window. Without coarse phase detector 194, controller 184 blindly or randomly modifies variable delay circuits 172 and 174 until the fine detect window is reached, which takes significantly longer than using coarse phase detector 194. Coarse phase detector 194 allows controller 184 to more quickly find the fine detect window.

Coarse phase detector 194 works well over a broad range of frequencies while fine phase detector 197 provides a high resolution of alignment. Coarse phase detector 194 allows controller 184 to quickly align two clock signals so that rising edges of the two clocks occur within $t_{DELAY}$ of each other, without regard to the frequency of the clock or how far misaligned or out of phase the two clock signals are. The resolution of fine phase detector 197 is high because the gain of ADC 206 is not compromised to broaden the fine detect window to allow operation over a wider frequency range. In one embodiment, the digital value of fine detection output 208 has a resolution of 100 femtoseconds (fs) of misalignment between two clock signals being compared.

FIGS. 5a-5d illustrate signal inputs to flip-flops 220 and 222 of coarse phase detector 194, as well as the value output bits 195 and 196 are set to on each rising edge of sample clocks 232 and 242. The X, or horizontal, axis of FIGS. 5a-5d illustrates time in picoseconds (ps), and the Y, or vertical, axis illustrates the logical values of the input signals to flip-flops 220 and 222.

Figure 5A:
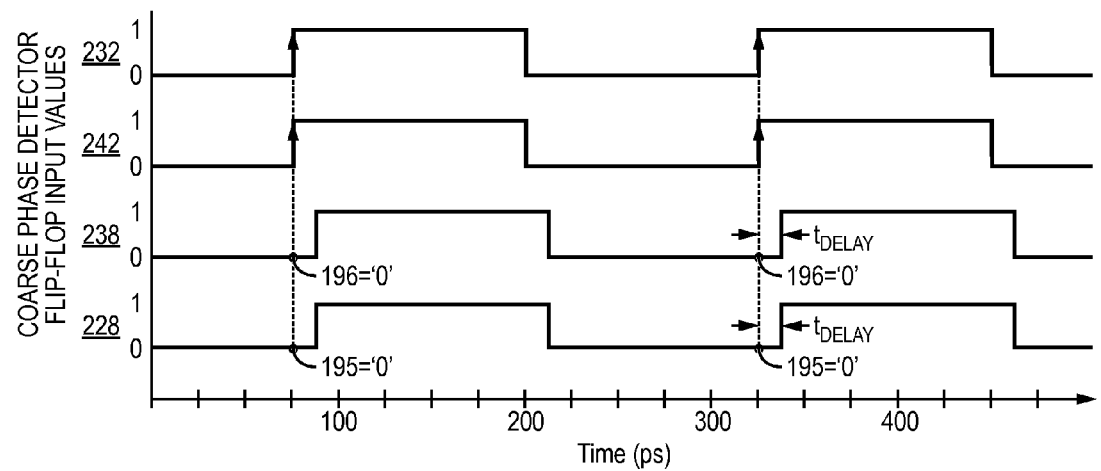
FIGS. 5a-5e illustrate signals used for coarse phase detection.

In FIG. 5a, clock signals 178 and 179 are in sync, and sample clocks 232 and 242 both include rising edges at 75 ps. The value of $t_{DELAY}$ is 12.5 ps, so both delayed clock signals 228 and 238 include rising edges at 87.5 ps. In other embodiments, $t_{DELAY}$ is between 10 ps and 20 ps. Flip-flop 220 sets output bit 195 to the value of delayed clock signal 228 at the rising edge of sample clock 232. Accordingly, at time=75 ps, output bit 195 is set to logic zero because delayed clock signal 228 is logic zero at 75 ps. Flip-flop 222 sets output bit 196 to the value of delayed clock signal 238 at the rising edge of sample clock 242. Accordingly, at time=75 ps, output bit 196 is set to logic zero because delayed clock signal 238 is logic zero at 75 ps. Controller 184 receives both output bits 195 and 196 as logic zero, and knows that clock signals 178 and 179 are within the fine detect window.

Figure 5B:
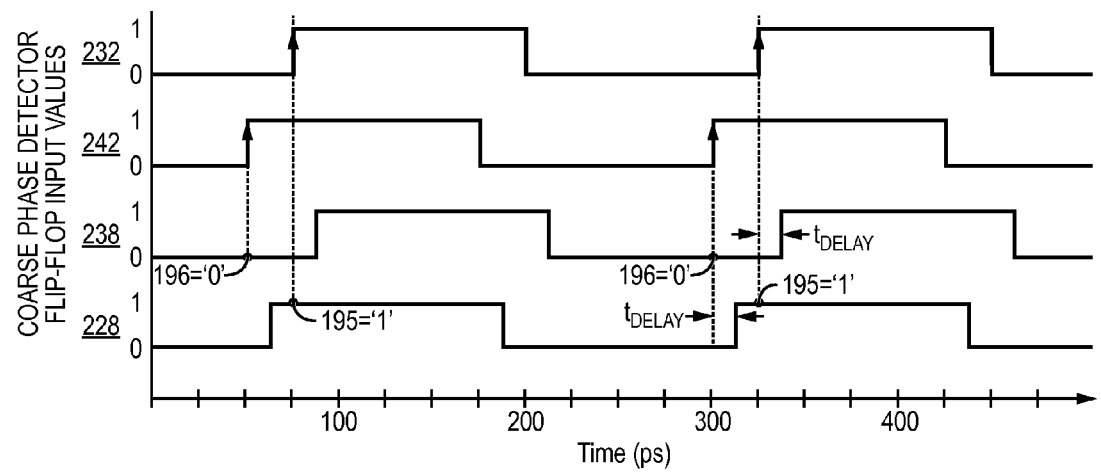

FIG. 5b illustrates clock signal 178 leading clock signal 179. Sample clock 242 has a rising edge at 50 ps, leading sample clock 232 which has a rising edge at 75 ps. The value of $t_{DELAY}$ is again 12.5 ps, putting a rising edge of delayed clock signal 228 at 62.5 ps and a rising edge of delayed clock signal 238 at 87.5 ps. Flip-flop 220 sets output bit 195 to the value of delayed clock signal 228 at the rising edge of sample clock 232. Accordingly, at time=75 ps, output bit 195 is set to logic one because delayed clock signal 228 already had a rising edge at 62.5 ps and is logic one at 75 ps. Flip-flop 222 sets output bit 196 to the value of delayed clock signal 238 at the rising edge of sample clock 242. Accordingly, at time=50 ps, output bit 196 is set to logic zero because delayed clock signal 238 is logic zero at 50 ps. Controller 184 receives output bit 195 as a logic one and output bit 196 as a logic zero, knows that clock signal 178 is leading clock signal 179, and adjusts variable delay circuits 172 and 174 accordingly to get closer to the fine detect window. Clock signals 178 and 179 are outside of the fine detect window because the amount of time from a rising edge of clock signal 178 to a rising edge of clock signal 179, i.e., 25 ps in FIG. 5b, is greater than $t_{DELAY}$, i.e., 12.5 ps.

Figure 5C:
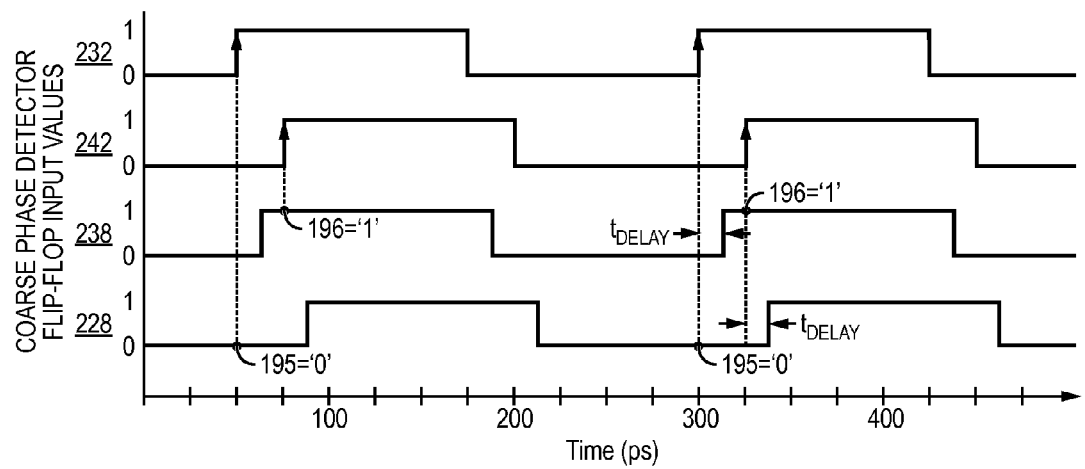

FIG. 5c illustrates clock signal 178 lagging behind clock signal 179. Sample clock 232 has a rising edge at 50 ps, leading sample clock 242 which has a later rising edge at 75 ps. The value of $t_{DELAY}$ is again 12.5 ps, putting a rising edge of delayed clock signal 238 at 62.5 ps and a rising edge of delayed clock signal 228 at 87.5 ps. Flip-flop 220 sets output bit 195 to the value of delayed clock signal 228 at the rising edge of sample clock 232. Accordingly, at time=50 ps, output bit 195 is set to logic zero because delayed clock signal 228 is logic zero at 50 ps. Flip-flop 222 sets output bit 196 to the value of delayed clock signal 238 at the rising edge of sample clock 242. Accordingly, at time=75 ps, output bit 196 is set to logic one because delayed clock signal 238 already had a rising edge at 62.5 ps and is logic one at 75 ps. Controller 184 receives output bit 195 as a logic zero and output bit 196 as a logic one, knows that clock signal 178 is lagging clock signal 179, and adjusts variable delay circuits 172 and 174 accordingly to get closer to the fine detect window. Clock signals 178 and 179 are outside of the fine detect window because the amount of time from a rising edge of clock signal 179 to a rising edge of clock signal 178, i.e., 25 ps in FIG. 5c, is greater than $t_{DELAY}$, i.e., 12.5 ps.

Figure 5D:
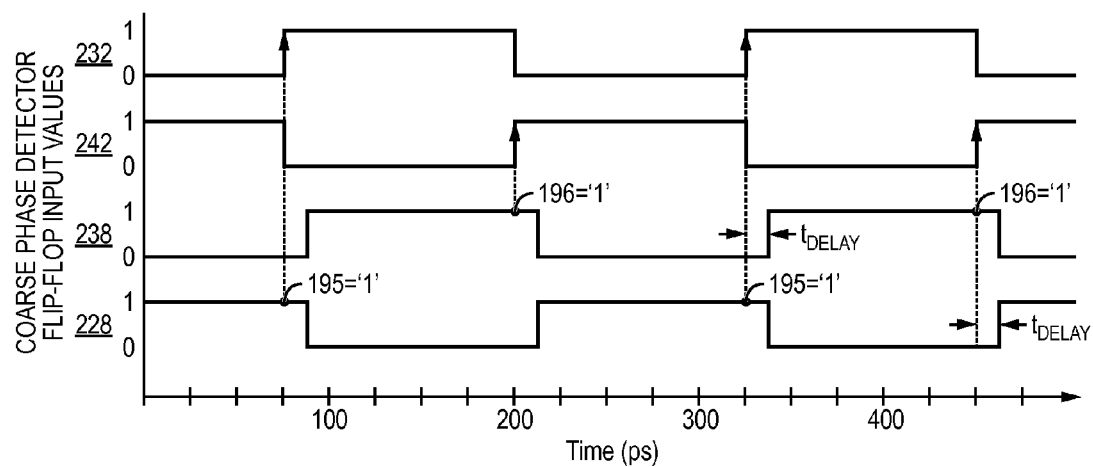

In FIG. 5d, clock signals 178 and 179 have a phase difference of approximately 180 degrees. Sample clock 232 has a rising edge at 75 ps, at which time sample clock 242 has a falling edge. Sample clock 242 has a rising edge at 200 ps, at which time sample clock 232 has a falling edge. The value of $t_{DELAY}$ is again 12.5 ps, putting a rising edge of delayed clock signal 238 at 87.5 ps and a rising edge of delayed clock signal 228 at 212.5 ps. Flip-flop 220 sets output bit 195 to the value of delayed clock signal 228 at the rising edge of sample clock 232. Accordingly, at time=75 ps, output bit 195 is set to a logic one because delayed clock signal 228 is a logic one. Flip-flop 222 sets output bit 196 to the value of delayed clock signal 238 at the rising edge of sample clock 242. Accordingly, at time=200 ps, output bit 196 is set to a logic one because delayed clock signal 238 is a logic one. Controller 184 receives both output bits 195 and 196 as logic one values, and knows that clock signal 178 is approximately 180 degrees out of phase with clock signal 179. Controller 184 adjusts variable delay circuits 172 and 174 in whichever direction is convenient, and clock signals 178 and 179 move closer to the fine detect window.

Figure 5E:
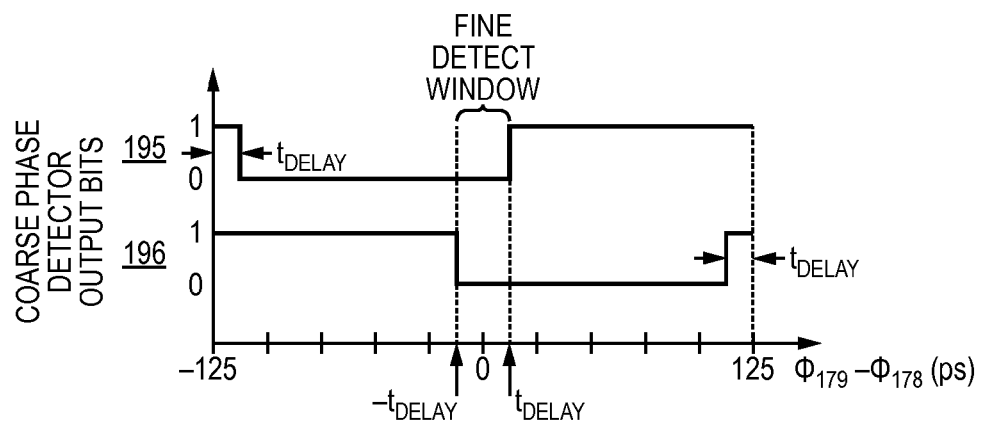

FIG. 5e illustrates the fine detect window relative to output bits 195 and 196. The X-axis of FIG. 5e indicates the number of picoseconds from a rising edge of clock signal 178 until a rising edge of clock signal 179. Positive values on the X-axis indicate an edge of clock signal 179 occurs after the same clock edge of clock signal 178. Negative values indicate that an edge of clock signal 179 occurs earlier than the same clock edge of clock signal 178. In FIG. 5e, the period of the clock signals is 250 ps, so the maximum time between a rising edge of one clock and the nearest rising edge of the other clock is 125 ps. The Y-axis illustrates the binary logic values of output bits 195 and 196 at the various phase differences. At 0 ps on the X-axis, a rising edge of clock signal 178 occurs at the same time as a rising edge of clock signal 179. Output bits 195 and 196 are both logic zero. As long as a rising edge of clock signal 178 occurs within $t_{DELAY}$ of a rising edge of clock signal 179, i.e., within plus or minus 12.5 ps in FIG. 5e, both output bits 195 and 196 remain logic zero. Controller 184 has clock signals 178 and 179 within the fine detect window when both output bits 195 and 196 are logic zero, and reads fine detection output 208 to further refine the alignment of clock signals 178 and 179.

When clock signal 179 lags clock signal 178 by greater than $t_{DELAY}$, or positive 12.5 ps in FIG. 5e, output bit 195 is a logic one while output bit 196 remains a logic zero. When clock signal 179 leads clock signal 178 by greater than $t_{DELAY}$, or negative 12.5 ps in FIG. 5e, output bit 196 is a logic one while output bit 195 remains a logic zero. When clock signals 178 and 179 are within $t_{DELAY}$ of being 180 degrees out of phase, both output bits 195 and 196 are logic one. In FIG. 5e, the period of the clock signals is 250 ps and $t_{DELAY}$ is 12.5 ps. Therefore, both output bits 195 and 196 are logic one when the same rising edge of clock signals 178 and 179 occurs separated in time by over 112.5 ps in either direction.

Figure 6A:
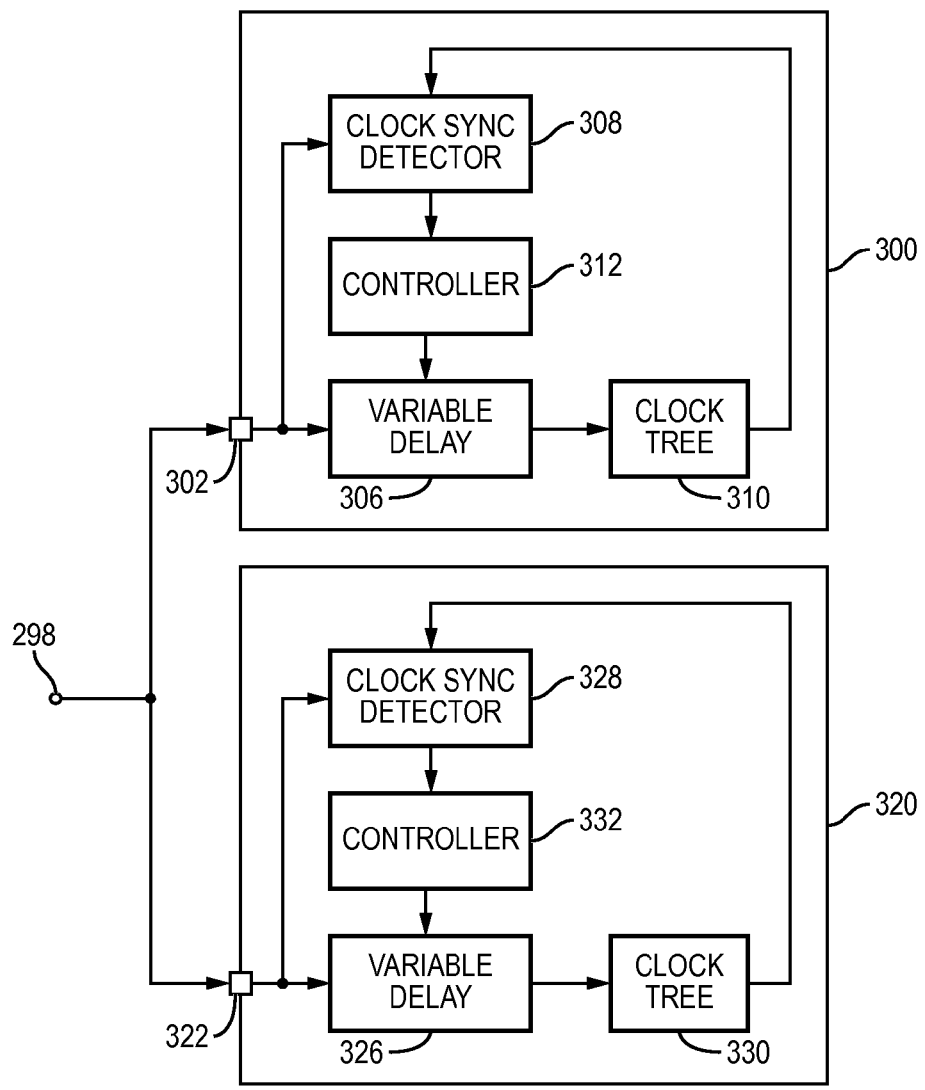
FIGS. 6a-6b illustrate a clock sync detector used in electronic devices.

FIG. 6a illustrates clock sync detectors used to synchronize the clock used by synchronous logic of two different semiconductor devices 300 and 320. Chips 300 and 320 communicate with each other synchronously, and each chip uses a clock sync detector to synchronize a clock used by internal synchronous logic to a common incoming clock signal 298. Chip 300 receives clock signal 298 at clock input terminal 302. Clock signal 298 is routed to variable delay circuit 306, as well as clock sync detector 308. Variable delay circuit 306 introduces a delay, and the delayed clock signal 298 is routed to clock tree 310. Clock tree 310 routes the clock signal around chip 300, where the clock signal is used to drive flip-flops and other clocked logic elements. The clock signal from variable delay circuit 306 is routed through clock tree 310 and output to clock sync detector block 308. Clock sync detector block 308 compares the phases of input clock 298 and the clock from clock tree 310, and outputs a digital value to controller 312 indicating the phase difference. Controller 312 outputs a control signal to adjust variable delay circuit 306, synchronizing the rising edge of clock 298 and the rising edge of the clock output from clock tree 310.

Figure 1:
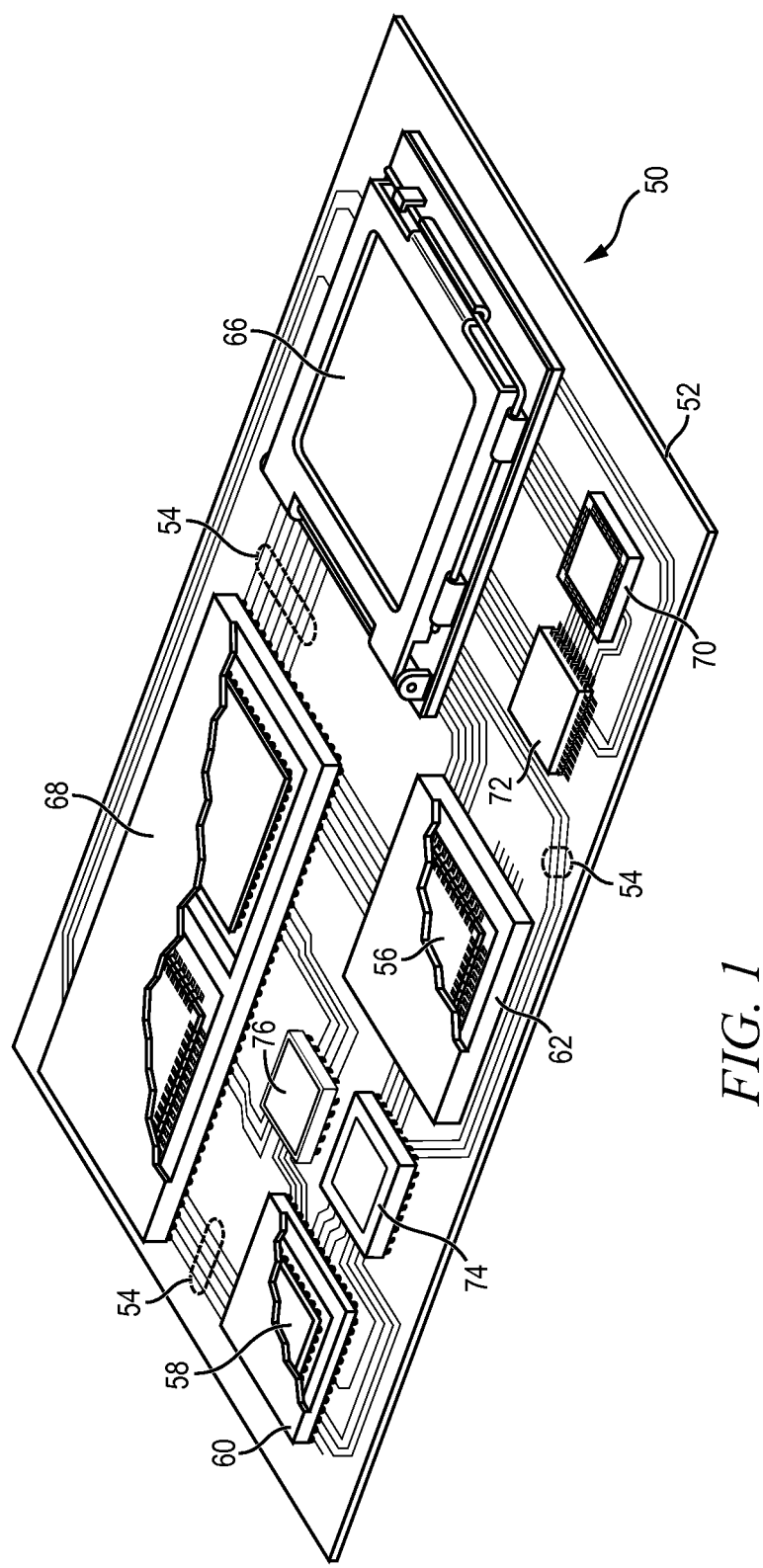
FIG. 1 illustrates an electronic device with multiple semiconductor packages.
Figure 2A:
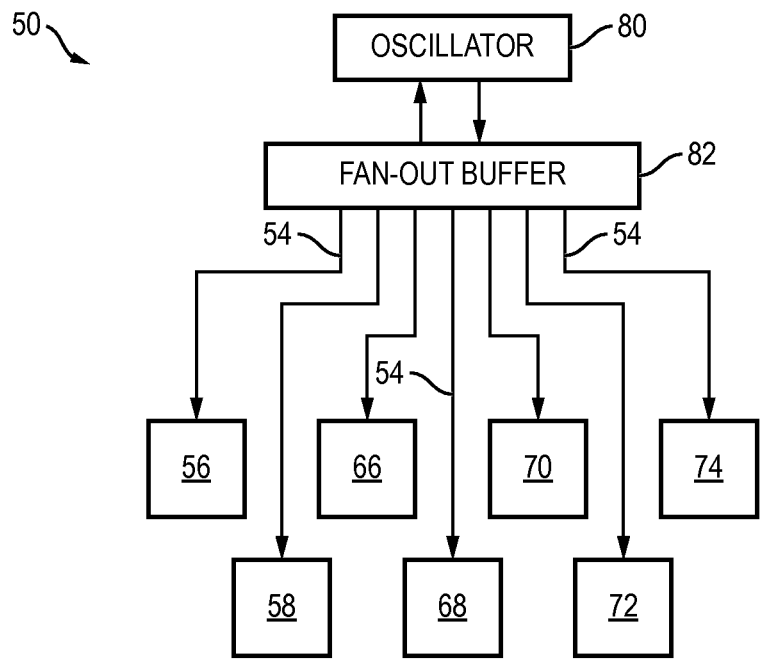
FIGS. 2a-2c illustrate a clock distribution system of an electronic device.
Figure 2B:
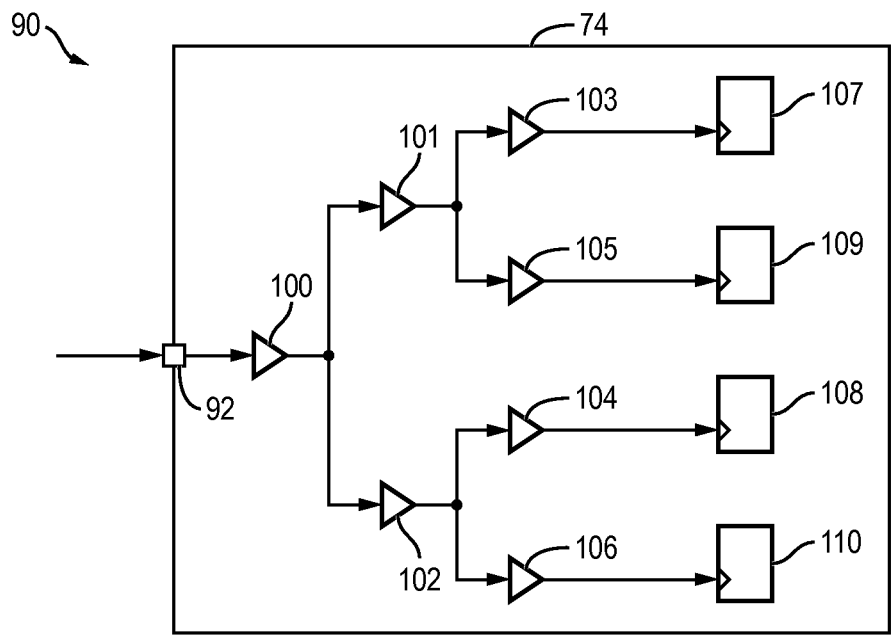
Figure 2C:
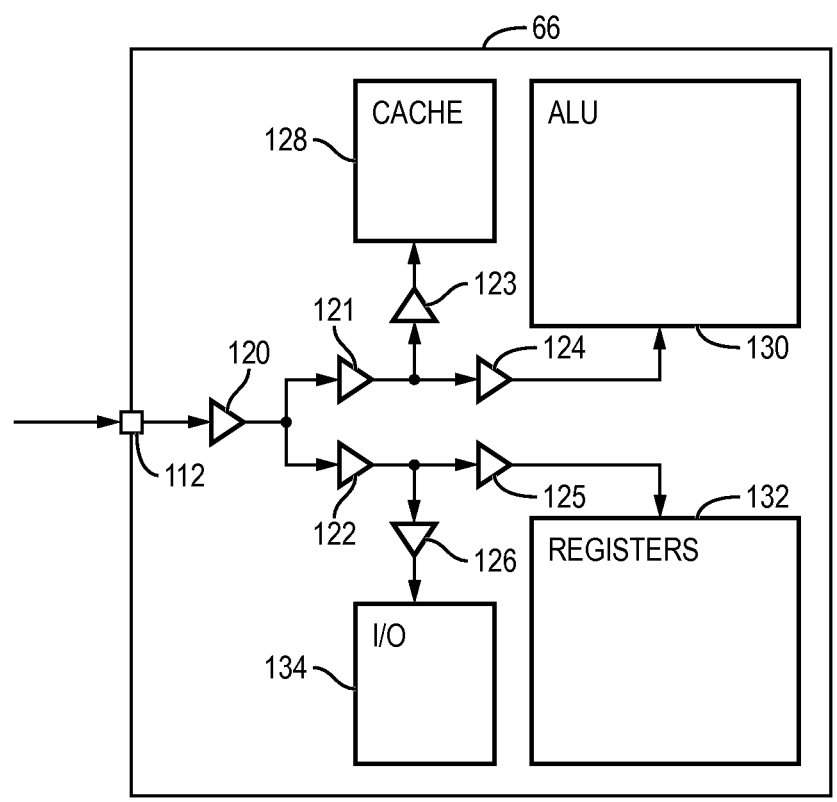
Figure 3:
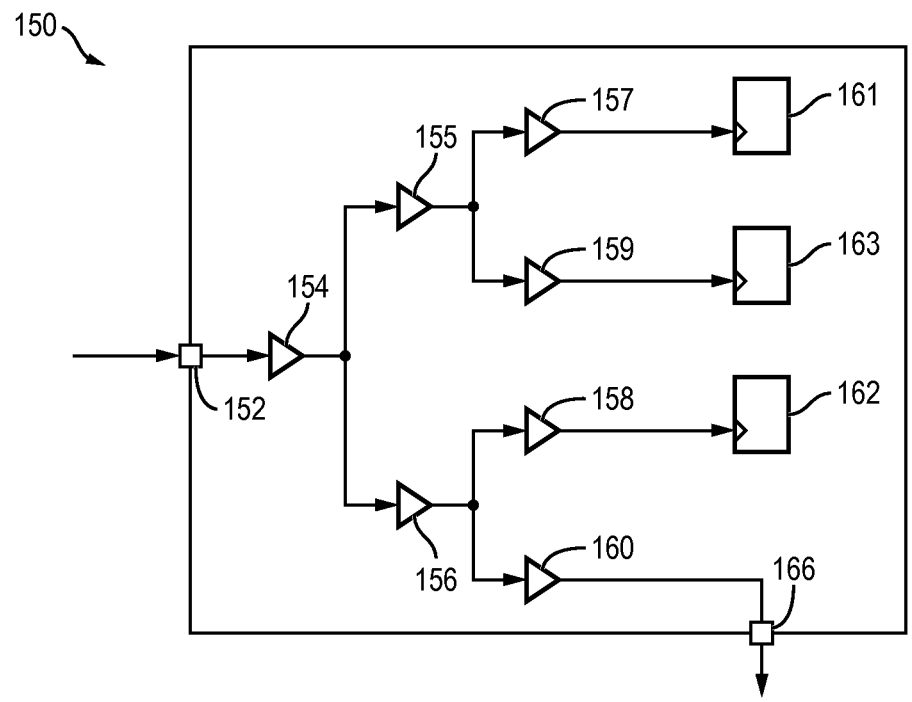
FIG. 3 illustrates a clock tree with feedback capability.

Variable delay circuit 306 operates similarly to a single variable delay circuit 172 or 174 in FIG. 4a. Variable delay circuit 306 introduces a delay between clock signal 298 and the flip-flops of clock tree 310. Clock tree 310 operates similarly to clock tree 150 in FIG. 3, and clock trees 176 and 177 in FIG. 4a. Clock tree 310 introduces a certain amount of delay between clock signal 298 and the flip-flops of the clock tree because of the conductive lines and buffers used to route the clock signal to the flip-flops. For the clock used by flip-flops in clock tree 310 to be synchronized with clock signal 298, the total delay of variable delay circuit 306 and clock tree 310 is one period of clock 298. With a delay of approximately one clock period between clock signal 298 and the delayed clock used by flip-flops in clock tree 310, the logic of clock tree 310 operates on a rising edge which occurs at approximately the same time as a rising edge of clock signal 298.

The clock signal delayed by variable delay circuit 306 and clock tree 310 is output to clock sync detector 308. Clock sync detector 308 operates similarly to clock sync detector 182 in FIGS. 4a-4d. Clock sync detector 308 compares clock signal 298 with the delayed clock signal from clock tree 310 to determine a phase difference between the two. Clock signal 298 and the clock signal from clock tree 310 are each connected to a coarse phase detector and fine phase detector in clock sync detector 308. The two-bit output from the coarse phase detector and the digital ADC output from the fine detection block are coupled to controller 312 to indicate how far out of phase the clock used by flip-flops in clock tree 310 is relative to clock signal 298. Controller 312 adjusts the delay of variable delay circuit 306 until clock sync detector 308 indicates that the flip-flops of clock tree 310 are running on a clock edge which occurs approximately at the same time as the clock edge of clock signal 298.

Chip 320 operates similarly to chip 300. Clock signal 298 is connected to clock input pin 322. Variable delay circuit 326 delays clock signal 298 prior to the clock going into clock tree 330. Clock tree 330 distributes the clock signal around chip 320 where the clock signal drives flip-flops and other clocked logic elements. The clock signal used by flip-flops of clock tree 330 is routed back to clock sync detector 328 which determines a phase difference between the clock from clock tree 330 and input clock signal 298. Controller 332 adjusts the delay of variable delay circuit 326 until clock sync detector 328 indicates that the flip-flops of clock tree 330 are running on a clock edge which occurs approximately at the same time as the clock edge of clock signal 298.

Flip-flops of clock tree 310 and flip-flops of clock tree 330 are each synchronized to use a clock signal which has a common clock edge with clock signal 298. Flip-flops of clock trees 310 and 330 each have a rising clock edge at approximately the same time. Therefore, clock tree 310 and clock tree 330 include signals between flip-flops of the two clock trees, and synchronous communication occurs without violating hold times or setup times of flip-flops of the other clock tree. In other embodiments, more than two chips each contain clock sync detectors so that any number of chips can communicate synchronously between the chips.

Figure 6B:
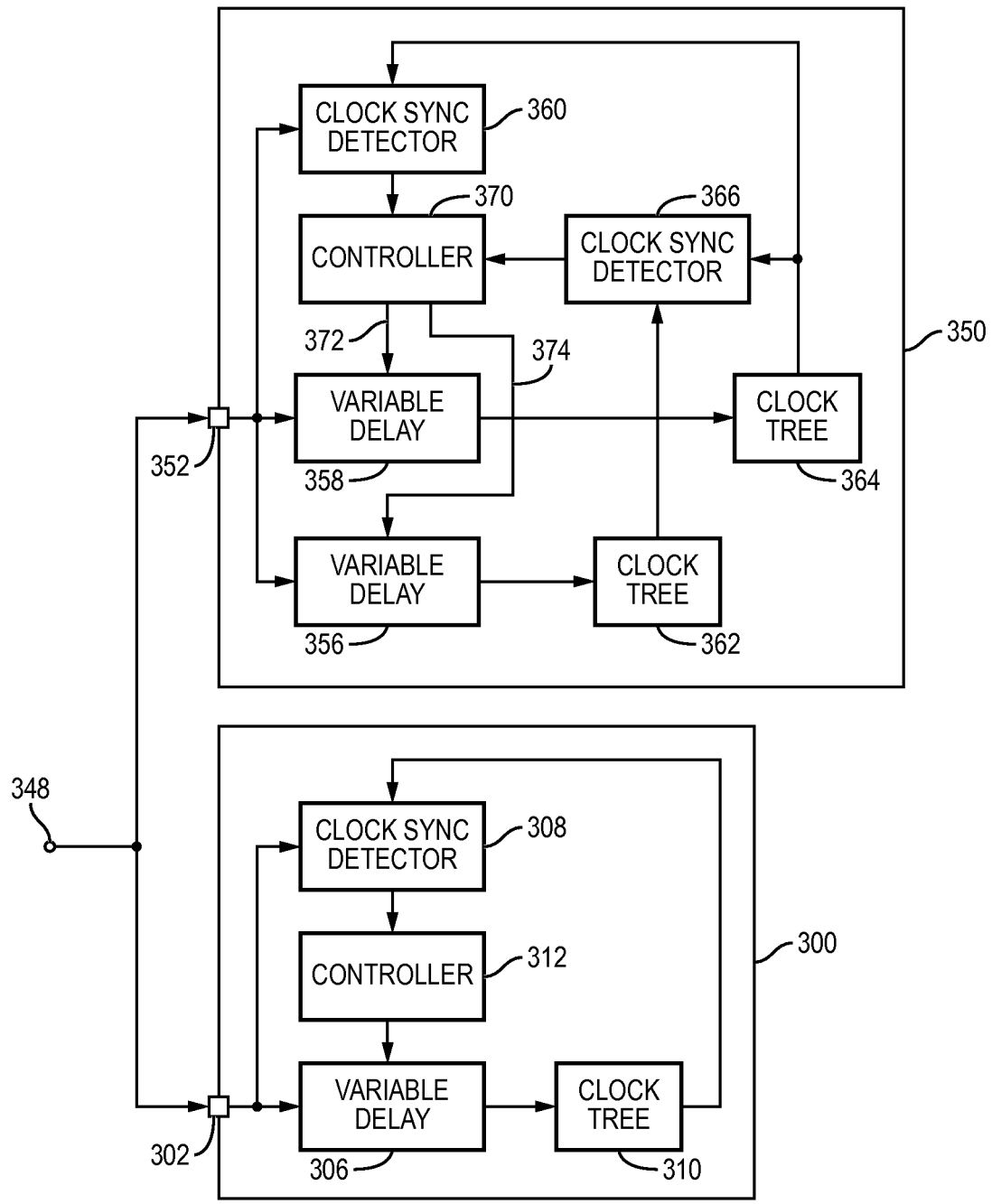

FIG. 6b illustrates chip 300 synchronized with semiconductor device or chip 350. Chip 350 includes two different clock trees synchronized to each other with one clock sync detector, and synchronized to input clock signal 348 with a second clock sync detector. Chip 350 includes clock input 352. Clock input 352 is coupled to variable delay circuit 356, variable delay circuit 358, and clock sync detector 360. Variable delay circuit 356 outputs a delayed version of clock signal 348 to clock tree 362. Variable delay circuit 358 outputs a delayed version of clock signal 348 clock tree 364. Clock trees 362 and 364 each output a clock signal to clock sync detector 366. Clock sync detector 366 compares the output clock of clock tree 362 against the output clock of clock tree 364, and reports coarse and fine phase difference binary values to controller 370. Clock tree 364 outputs a clock signal to clock sync detector 360, as well as clock sync detector 366. Clock sync detector 360 compares the output clock of clock tree 364 against clock signal 348 from clock input 352, and reports coarse and fine phase difference binary values to controller 370.

Controller 370 adjusts variable delay circuit 358 so that the total cumulative delay of variable delay circuit 358 and clock tree 364 is approximately equal to one clock cycle of clock signal 348, which aligns the clock edges of clock tree 364 with clock signal 348. Controller 370 receives feedback from clock sync detector 360 to discover when clock tree 364 is in sync with clock signal 348, or how far out of sync the clock tree is. When clock tree 364 is in sync with clock signal 348, synchronous logic in clock tree 364 is able to communicate with synchronous logic in clock tree 310 of device 300.

Controller 370 adjusts variable delay circuit 356 so that the total cumulative delay of variable delay circuit 356 and clock tree 362 is approximately equal to the cumulative delay of variable delay circuit 358 and clock tree 364, which aligns the clock edges of clock tree 362 with clock tree 364. Controller 370 receives feedback from clock sync detector 366 to discover when clock tree 362 is in sync with clock tree 364, or how far out of sync the clock trees are. When clock tree 362 is in sync with clock tree 364, synchronous logic in clock tree 362 is able to communicate with synchronous logic in clock tree 364. Because clock tree 364 is synchronized with clock tree 310 of chip 300, clock tree 362 also communicates synchronously with clock tree 310.

Chip 350 uses two clock sync detector blocks and a single controller to synchronize two internal clock trees to an input clock. In other embodiments, any number of clock sync detector blocks are used with a single controller to synchronize any number of clock trees in a single chip with an input clock. In some embodiments, separate controllers are used for each variable delay circuit coupled to a different clock tree. Clock tree 310 in chip 300 is synchronized with clock trees 362 and 364 of chip 350 because each clock tree is synchronized to clock signal 348.

Clock sync detectors 308, 360, and 366 utilize both coarse phase detectors and fine phase detectors. The coarse phase detectors allow controllers 312 and 370 to bring the respective clock signals within a fine detect window quickly. The fine phase detectors allow controllers 312 and 370 to fine tune the alignment of the respective clock signals with a high resolution within the fine detect window. Using coarse phase detection along with fine phase detection reduces the overall system synchronization time.

While one or more embodiments of the present invention have been illustrated in detail, the skilled artisan will appreciate that modifications and adaptations to those embodiments may be made without departing from the scope of the present invention as set forth in the following claims.

What is claimed:

1. A clock synchronization circuit, comprising:
   a fine phase detector including two output bits;
   a charge pump coupled to the two output bits;
   a filter coupled to an output of the charge pump;
   an analog-to-digital converter coupled to an output of the charge pump;
   a coarse phase detector including,
      a first flip-flop,
      a first delay element coupled to a data input of the first flip-flop,
      a first clock signal coupled to the data input of the first flip-flop through the first delay element,
      a second clock signal coupled to a clock input of the first flip-flop,
      a second flip-flop with the first clock signal coupled to a clock input of the second flip-flop, and
      a second delay element coupled between the second clock signal and a data input of the second flip-flop, wherein the second delay element is configured to provide a signal delay approximately equal to a signal delay of the first delay element;
   a first variable delay circuit including an output coupled to provide the first clock signal to a first input of the fine phase detector and a first input of the coarse phase detector; and
   a controller including a first input coupled to a first output bit of the first flip-flop and a second output bit of second flip-flop, a second input of the controller coupled to an output of the analog-to-digital converter, and an output of the controller coupled to a control input of the first variable delay circuit, wherein the controller is configured to adjust the first variable delay circuit based on the fine phase detector when the coarse phase detector indicates that the first clock signal and second clock signal are within a fine detect window.

2. The clock synchronization circuit of claim 1, wherein the second clock signal is coupled to a second input of the fine phase detector.

3. The clock synchronization circuit of claim 1, wherein the coarse phase detector further includes a second variable delay circuit comprising the first delay element.

4. The clock synchronization circuit of claim 1, further including a second variable delay circuit coupled to provide the second clock signal to a second input of the fine phase detector and a second input of the coarse phase detector.

5. The clock synchronization circuit of claim 2, further including a multiplexer (MUX) comprising a first input coupled to the first clock signal through the first variable delay circuit, a second input of the MUX coupled to the second clock signal, and an output of the MUX coupled to the first input of the fine phase detector.

6. The clock synchronization circuit of claim 1, further including an offset compensation coupled between the fine phase detector and controller.

7. A clock synchronization circuit, comprising:
   a first flip-flop;
   a first delay element coupled to a data input of the first flip-flop;
   a first clock signal coupled to the data input of the first flip-flop through the first delay element;
   a second clock signal coupled to a clock input of the first flip-flop;
   a second flip-flop including a clock input of the second flip-flop coupled to the first clock signal; and
   a second delay element coupled between the second clock signal and a data input of the second flip-flop with a delay value of the second delay element approximately equal to a delay value of the first delay element, wherein the delay values define a fine detect window.

8. The clock synchronization circuit of claim 7, further including a variable delay circuit, wherein the second clock signal is coupled to the clock input of the first flip-flop through the variable delay circuit.

9. The clock synchronization circuit of claim 8, further including a clock tree, wherein the second clock signal is coupled to the clock input of the first flip-flop through the variable delay circuit and clock tree.

10. The clock synchronization circuit of claim 8, further including a controller comprising a first input coupled to an output of the first flip-flop, a second input of the controller coupled to an output of the second flip-flop, and an output of the controller coupled to the variable delay circuit, wherein the controller includes a digital microcontroller, processor, or central processing unit.

11. The clock synchronization circuit of claim 7, further including a third flip-flop comprising a clock input coupled to the first clock signal.

12. The clock synchronization circuit of claim 11, further including a fourth flip-flop comprising a clock input coupled to the second clock signal.

13. The clock synchronization circuit of claim 10, further including a fine phase detection block comprising a first input coupled to the first clock signal, a second input of the fine phase detection block coupled to the second clock signal, and a multi-bit digital output of the fine phase detection block coupled to a third input of the controller.

14. The clock synchronization circuit of claim 13, wherein the controller is configured to adjust the variable delay circuit based on the fine phase detection block when the output of the first flip-flop and output of the second flip-flop are both logic zero values.

15. A clock synchronization circuit, comprising:
a first flip-flop;
a first clock signal coupled to a data input of the first flip-flop;
a second clock signal coupled to a clock input of the first flip-flop;
a second flip-flop including a data input of the second flip-flop coupled to the second clock signal and a clock input of the second flip-flop coupled to the first clock signal;
a fine phase detection block comprising an analog-to-digital converter coupled to the first clock signal and second clock signal in parallel with the first flip-flop; and
a controller including a first input coupled to an output of the first flip-flop, a second input of the controller coupled to an output of the second flip-flop, and a third input of the controller coupled to an output of the analog-to-digital converter.

16. The clock synchronization circuit of claim 15, further including a first delay element coupled between the first clock signal and data input of the first flip-flop.

17. The clock synchronization circuit of claim 15, wherein the fine phase detection block includes an offset compensation to calibrate the fine phase detection block.

18. The clock synchronization circuit of claim 15, further including a variable delay element coupled to an output of the controller, wherein the first clock signal is routed from the variable delay element to the fine phase detection block, first flip-flop, and second flip-flop.

19. The clock synchronization circuit of claim 18, further including a clock tree coupled between the variable delay element and the first flip-flop, second flip-flop, and fine phase detection block.

20. A method of making a clock synchronization circuit, comprising:
providing a first flip-flop;
coupling a first delay element to a first input of the first flip-flop;
coupling a first clock signal to the first input of the first flip-flop through the delay element;
coupling a second clock signal to a second input of the first flip-flop;
providing a second flip-flop;
coupling a second delay element to a first input of the second flip-flop;
coupling the second clock signal to the first input of the second flip-flop through the second delay element;
coupling the first clock signal to a second input of the second flip-flop;
providing a fine phase detector including a digital output;
providing a controller coupled to an output of the first flip-flop, an output of the second flip-flop, and the digital output of the fine phase detector; and
configuring the controller to adjust a delay of the first clock signal based on the output of the fine phase detector when the output of the first flip-flop and the output of the second flip-flop are both logic zero values.

21. The method of claim 20, further including:
coupling the first clock signal to a clock input of a third flip-flop; and
coupling the second clock signal to a clock input of a fourth flip-flop.

22. The method of claim 20, further including providing a first variable delay circuit comprising an input of the variable delay circuit coupled to a control output signal of the controller and an output of the first variable delay circuit configured to provide the first clock signal to the first input of the first flip-flop, the second input of the second flip-flop, and an input of the fine phase detector.

23. The method of claim 22, further including:
adjusting the first variable delay circuit based on the output of the first flip-flop and the output of the second flip-flop when the outputs of the first flip-flop and second flip-flop are not both logic zero values; and
adjusting the first variable delay circuit based on the output of the fine phase detector when the outputs of the first flip-flop and second flip-flop are both logic zero values.

24. The method of claim 20, further including providing the first delay element and second delay element to provide approximately equal signal delay.

25. The method of claim 20, wherein the first delay element and second delay element define a fine detect window.

* * * * *